(12) United States Patent
Satoh

(10) Patent No.: US 7,652,946 B2
(45) Date of Patent: Jan. 26, 2010

(54) SEMICONDUCTOR DEVICE

(75) Inventor: Masayuki Satoh, Gunma (JP)

(73) Assignee: Taiyo Yuden Corp., Tokyo (JP)

( * ) Notice: Subject to any disclaimer, the term of this patent is extended or adjusted under 35 U.S.C. 154(b) by 0 days.

(21) Appl. No.: 12/094,770

(22) PCT Filed: Jul. 6, 2006

(86) PCT No.: PCT/JP2006/313502

§ 371 (c)(1),
(2), (4) Date: Nov. 21, 2008

(87) PCT Pub. No.: WO2007/060763

PCT Pub. Date: May 31, 2007

(65) Prior Publication Data

US 2009/0154282 A1      Jun. 18, 2009

(30) Foreign Application Priority Data

Nov. 28, 2005   (WO) ................. PCT/JP2005/021758

(51) Int. Cl.
*G11C 8/00* (2006.01)
(52) U.S. Cl. ........................... 365/230.03; 365/230.06; 365/189.011
(58) Field of Classification Search ............ 365/230.03, 365/230.06, 189.011
See application file for complete search history.

(56) References Cited

U.S. PATENT DOCUMENTS 6,347,063 B1 * 2/2002 Dosaka et al. ......... 365/230.03

FOREIGN PATENT DOCUMENTS

JP        2003 149300 A    5/2003
JP        2003 224468 A    8/2003

* cited by examiner

*Primary Examiner*—Huan Hoang
(74) *Attorney, Agent, or Firm*—Knobbe Martens Olson & Bear LLP

(57) ABSTRACT

A semiconductor device comprises multiple memory cell blocks including multiple memory cells for storing a predetermined amount of data. Each of the memory cell blocks having three or more inputs and three or more outputs includes two readout address decoders as to the memory cells internally, stores truth table data for outputting a desired logical value as to predetermined address input, and is configured so as to operate as a logic circuit. Also, the memory cells include two readout word lines corresponding to the two readout address decoders, and in the case of the voltage of both of the two readout word lines being applied, the data held at this time is read out from readout data lines. Further, between the memory cell blocks is connected such that the three or more outputs from one memory cell block are input to three or more other memory cell blocks.

17 Claims, 21 Drawing Sheets

600 TRUTH TABLE

| A0<br>E | A1<br>F | A2 | A3<br>Cin | D0 | D1 | D2<br>Cout | D3<br>Y |
|---|---|---|---|---|---|---|---|
| 0 | 0 | 0 | 0 | 0 | 0 | 0 | 0 |
| 1 | 0 | 0 | 0 | 0 | 0 | 0 | 1 |
| 0 | 1 | 0 | 0 | 0 | 0 | 0 | 1 |
| 1 | 1 | 0 | 0 | 0 | 0 | 1 | 0 |
| 0 | 0 | 1 | 0 | 0 | 0 | 0 | 0 |
| 1 | 0 | 1 | 0 | 0 | 0 | 0 | 1 |
| 0 | 1 | 1 | 0 | 0 | 0 | 0 | 1 |
| 1 | 1 | 1 | 0 | 0 | 0 | 1 | 0 |
| 0 | 0 | 0 | 1 | 0 | 0 | 0 | 1 |
| 1 | 0 | 0 | 1 | 0 | 0 | 1 | 0 |
| 0 | 1 | 0 | 1 | 0 | 0 | 1 | 0 |
| 1 | 1 | 0 | 1 | 0 | 0 | 1 | 1 |
| 0 | 0 | 1 | 1 | 0 | 0 | 0 | 1 |
| 1 | 0 | 1 | 1 | 0 | 0 | 1 | 0 |
| 0 | 1 | 1 | 1 | 0 | 0 | 1 | 0 |
| 1 | 1 | 1 | 1 | 0 | 0 | 1 | 1 |

TRUTH TABLE 700

| A0 | A1 Y | A2 | A3 | D0 | D1 | D2 | D3 Y |
|---|---|---|---|---|---|---|---|
| 0 | 0 | 0 | 0 | 0 | 0 | 0 | 0 |
| 1 | 0 | 0 | 0 | 0 | 0 | 0 | 0 |
| 0 | 1 | 0 | 0 | 0 | 0 | 0 | 1 |
| 1 | 1 | 0 | 0 | 0 | 0 | 0 | 1 |
| 0 | 0 | 1 | 0 | 0 | 0 | 0 | 0 |
| 1 | 0 | 1 | 0 | 0 | 0 | 0 | 0 |
| 0 | 1 | 1 | 0 | 0 | 0 | 0 | 1 |
| 1 | 1 | 1 | 0 | 0 | 0 | 0 | 1 |
| 0 | 0 | 0 | 1 | 0 | 0 | 0 | 0 |
| 1 | 0 | 0 | 1 | 0 | 0 | 0 | 0 |
| 0 | 1 | 0 | 1 | 0 | 0 | 0 | 1 |
| 1 | 1 | 0 | 1 | 0 | 0 | 0 | 1 |
| 0 | 0 | 1 | 1 | 0 | 0 | 0 | 0 |
| 1 | 0 | 1 | 1 | 0 | 0 | 0 | 0 |
| 0 | 1 | 1 | 1 | 0 | 0 | 0 | 1 |
| 1 | 1 | 1 | 1 | 0 | 0 | 0 | 1 |

TRUTH TABLE 800

| A0 C | A1 Y | A2 | A3 | D0 | D1 C | D2 | D3 Y |
|---|---|---|---|---|---|---|---|
| 0 | 0 | 0 | 0 | 0 | 0 | 0 | 0 |
| 1 | 0 | 0 | 0 | 0 | 1 | 0 | 0 |
| 0 | 1 | 0 | 0 | 0 | 0 | 0 | 1 |
| 1 | 1 | 0 | 0 | 0 | 1 | 0 | 1 |
| 0 | 0 | 1 | 0 | 0 | 0 | 0 | 0 |
| 1 | 0 | 1 | 0 | 0 | 1 | 0 | 0 |
| 0 | 1 | 1 | 0 | 0 | 0 | 0 | 1 |
| 1 | 1 | 1 | 0 | 0 | 1 | 0 | 1 |
| 0 | 0 | 0 | 1 | 0 | 0 | 0 | 0 |
| 1 | 0 | 0 | 1 | 0 | 1 | 0 | 0 |
| 0 | 1 | 0 | 1 | 0 | 0 | 0 | 1 |
| 1 | 1 | 0 | 1 | 0 | 1 | 0 | 1 |
| 0 | 0 | 1 | 1 | 0 | 0 | 0 | 0 |
| 1 | 0 | 1 | 1 | 0 | 1 | 0 | 0 |
| 0 | 1 | 1 | 1 | 0 | 0 | 0 | 1 |
| 1 | 1 | 1 | 1 | 0 | 1 | 0 | 1 |

FIG. 20A  COMMON CMOS                    FIG. 20B   SEPARATED CMOS
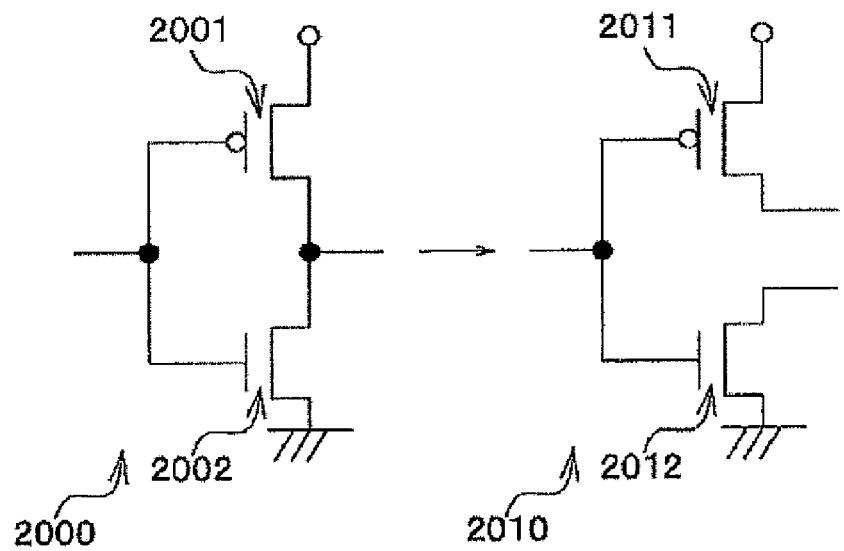
FIG. 20C  NAND CIRCUIT EMPLOYING COMMON CMOS
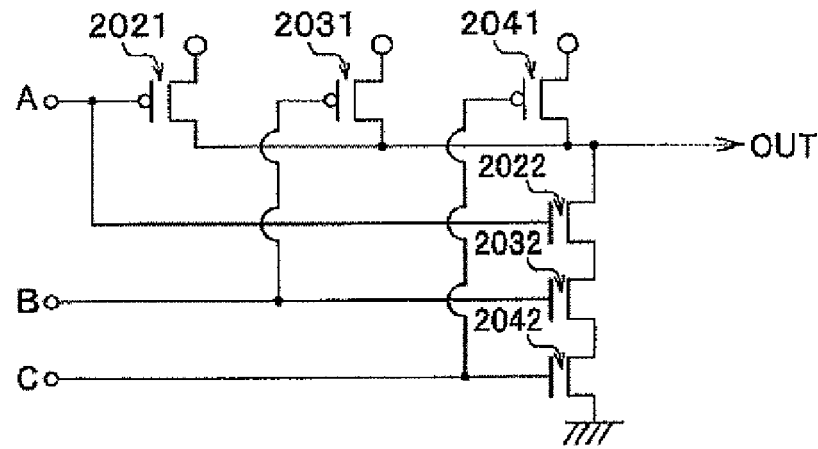
FIG. 20D  NAND CIRCUIT ACCORDING TO EMBODIMENT OF PRESENT INVENTION
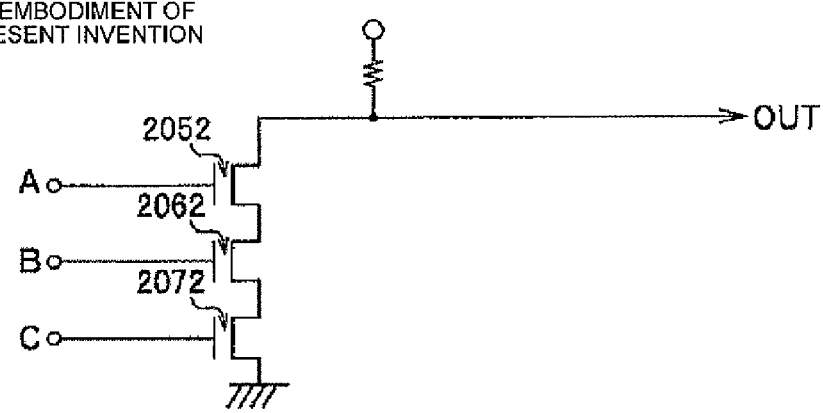

SEMICONDUCTOR DEVICE

BACKGROUND OF THE INVENTION

1. Field of the Invention

The present invention relates to a semiconductor device whereby memory can operate as a logic circuit.

2. Description of the Related Art

Heretofore, semiconductor devices, such as LSIs (Large Scale Integration) and so forth, have been manufactured through many processes, such as functional design, logic circuit design, wafer manufacturing, assembly, and so forth. The manufacturing process thereof has been suitable for mass production for the same product, but has been unsuitable for small-lot production of various products, since such production is costly.

Therefore, manufacturing technology of devices such as such as FPGAs (Field Programmable Gate Array) and so forth, has been developed such that even if the same semiconductor devices is manufactured in mass, the customer side can handle these as separate products. An FPGA is a semiconductor device, such as an LSI or the like, whereby a logic circuit can be programmed after manufacturing.

However, an FPGA is configured of various types of components, such as a logic circuit, wiring, switch, and so forth, so there has been a problem in that a multilayer wiring configuration of the number of wiring layers on a semiconductor process, and advanced manufacturing technology, are needed.

As a solution, a technique for operating memory as a logic circuit has been developed. For example, with Japanese Unexamined Patent Application Publication No. 2003-149300, a technique has been disclosed regarding a semiconductor device wherein a plurality of memory are connected by wiring, and predetermined truth values are written in the memory so as to output predetermined data as to predetermined address input, thereby operating as a logic circuit.

Also, with Japanese Unexamined Patent Application Publication No. 2003-224468, a technique has been disclosed regarding a semiconductor device wherein truth table data is written in memory, such as SRAM (Static Random Access Memory) or the like, and an address is taken as input, and data is taken as output, thereby operating as a logic circuit.

Note however, with the semiconductor device according to Japanese Unexamined Patent Application Publication No. 2003-149300, there has been a problem wherein in a case in which the truth-values in the memory are rewritten, reconnection of wiring is needed.

Also, with the semiconductor device according to Japanese Unexamined Patent Application Publication No. 2003-224468, there has been a problem wherein memory cell blocks in which multiple memory cells for storing a predetermined amount of data are collected are disposed in an arrayed manner, and the data from a single memory cell block is output to only the two of adjacent four memory cell blocks (e.g., right and bottom of the left, right, top and bottom), so it is difficult to operate as a logic circuit for feeding back data (returning to the original memory cell block). Also, the appropriate scale of memory cell block (the number of inputs and the number of outputs) has not been taken into consideration.

SUMMARY OF THE INVENTION

Accordingly, it has been recognized in light of the above-mentioned problems that there is a need to provide a semiconductor device which is memory operating as a logic circuit, whereby truth values in the memory can be rewritten without reconnecting wiring, data can be fed back, and further, the scale of memory cell blocks can be optimized.

To this end, a semiconductor device includes multiple memory cell blocks including multiple memory cells for storing a predetermined amount of data. Each of the memory cell blocks having three or more inputs and three or more outputs includes two readout address decoders as to the memory cells internally, stores truth table data for outputting a desired logical value as to predetermined address input, and is configured so as to operate as a logic circuit. Also, the memory cells include two readout word lines corresponding to the two readout address decoders, and in the case of the voltage of both of the two readout word lines being applied, the data held at this time is read out from readout data lines. Further, between the memory cell blocks is connected such that the three or more outputs from one memory cell block are input to three or more other memory cell blocks.

According to an embodiment of the present invention, there can be provided a semiconductor device which is memory operating as a logic circuit, whereby truth values in the memory can be rewritten without reconnecting wiring, data can be fed back, and further, the scale of memory cell blocks can be optimized.

BRIEF DESCRIPTION OF THE DRAWINGS

FIG. 10 is a diagram illustrating a connection situation of readout ports in a semiconductor device 110a.

FIG. 11 is an internal configuration diagram of the semiconductor device 110a.

FIG. 20A is a configuration diagram of a common CMOS, FIG. 20B is a configuration diagram in a case wherein a CMOS is separated, FIG. 20C is a configuration diagram of a NAND circuit employing a common CMOS, and FIG. 20D is a configuration diagram of a NAND circuit according to an embodiment of the present invention.

DESCRIPTION OF THE PREFERRED EMBODIMENTS

Description will be made below regarding a semiconductor device according to an embodiment of the present invention with reference to the drawings.

Figure 1:
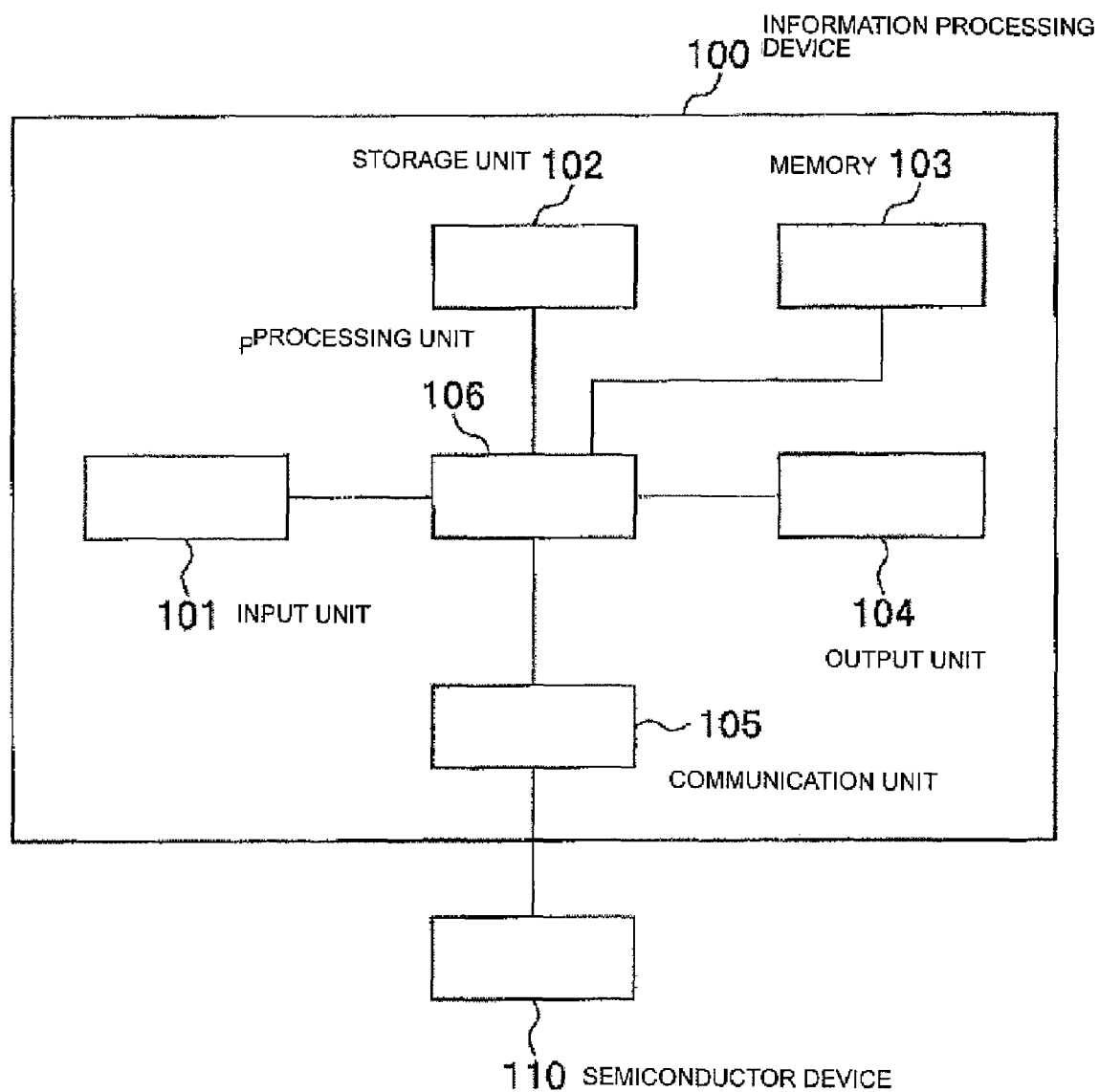
FIG. 1 is a configuration diagram of a semiconductor device and an information processing device.

FIG. 1 is a configuration diagram of a semiconductor device and an information processing device. An information processing device 100 is a computer device, and includes an input unit 101 such as a keyboard and so forth, a storage unit 102 such as a hard disk or the like, memory 103 such as RAM (Random Access Memory) or the like, an output unit 104 such as a CRT (Cathode Ray Tube) and so forth, a communication unit 105 which is a communication device, and a processing unit 106 such as a CPU (Central Processing Unit) or the like. Note that bit data (later described in step S1204 in FIG. 12) created by the information processing device 100 may be held in an unshown ROM (Read Only Memory).

A semiconductor device 110 is connected to the communication unit 105 of the information processing device 100. The semiconductor device 110 is, in point of hardware, for example, the same storage device as common SRAM (Static Random Access Memory), and the details will be described in FIG. 2 and thereafter.

Figure 2:
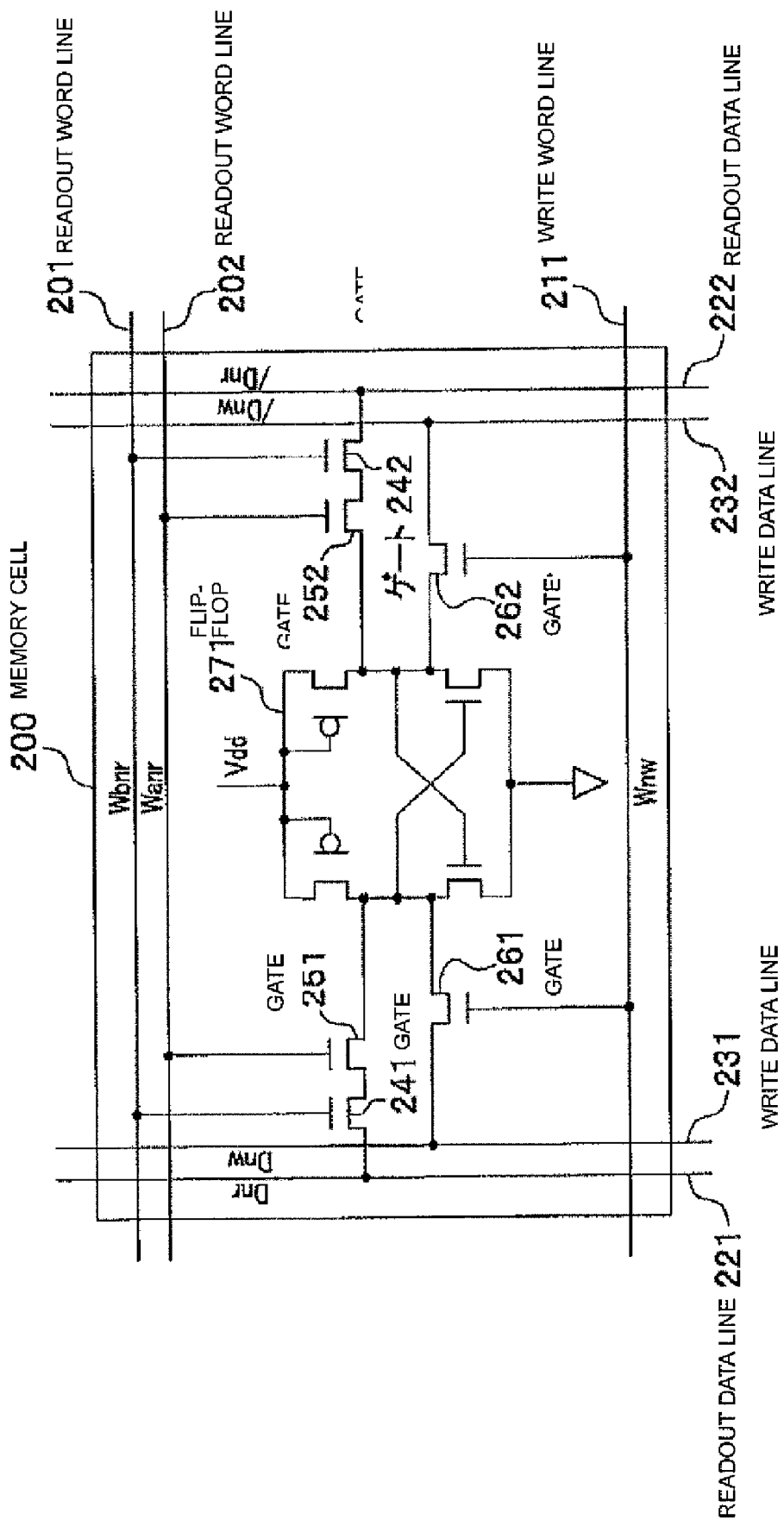
FIG. 2 is a configuration diagram of a memory cell which is a storage element making up a semiconductor device 110 shown in FIG. 1.

FIG. 2 is a configuration diagram of a memory cell which is a storage element making up the semiconductor device 110 shown in FIG. 1. A memory cell 200 is configured of a readout word lines 201 and 202, write word line 211, readout data lines 221 and 222, write data lines 231 and 232, gates 241, 242, 251, 252, 261, and 262, and a flip-flop 271.

An arrangement is made wherein the gates 241, 242, 251, 252, 261, and 262 are configured of an N-MOS (Negative-Metal Oxide Semiconductor), but these gates may be configured of a P-MOS (Positive-Metal Oxide Semiconductor) instead, and further, may be configured of a compound gate of an N-MOS and P-MOS. This case can be handled by modifying the peripheral circuits thereof as necessary. Also, the gates 241 and 251 and so forth are configured of a so-called double gate, but may be configured of a single gate so as to have the same function.

The readout word lines 201 and 202 are wiring to which voltage is applied when reading out the data of the memory cell 200 externally. Upon the voltage of the readout word line 201 being applied, the gate 241 and gate 242 are opened, and upon the voltage of the readout word line 202 being applied, the gate 251 and gate 252 are opened.

The write word line 211 is wiring to which voltage is applied when writing data in the memory cell 200 externally. Upon the voltage of the write word line 211 being applied, the gate 261 and gate 262 are opened.

The readout data lines 221 and 222 are wiring for reading out the data held at the flip-flop 271, when predetermined voltage is applied to the readout word lines 201 and 202, and the gates 241, 242, 251, and 252 are opened. Note that when data "0" is read out from the readout data line 221, data "1" is read out from the readout data line 222, and when data "1" is read out from the readout data line 221, data "0" is read out from the readout data line 222, thereby performing so-called differential signal operation.

The write data lines 231 and 232 are wiring for writing data in the flip-flop 271, when the voltage of the write word line 211 is applied, and the gate 261 and gate 262 are opened. An arrangement is made wherein, when data "0" is written from the write data line 231, data "1" is written from the write data line 232, and when data "1" is written from the write data line 231, data "0" is written from the write data line 232. The flip-flop 271 is a storage circuit for holding data of "0" or "1" to be stored in the memory cell 200 in the above-mentioned sense.

Figure 3:
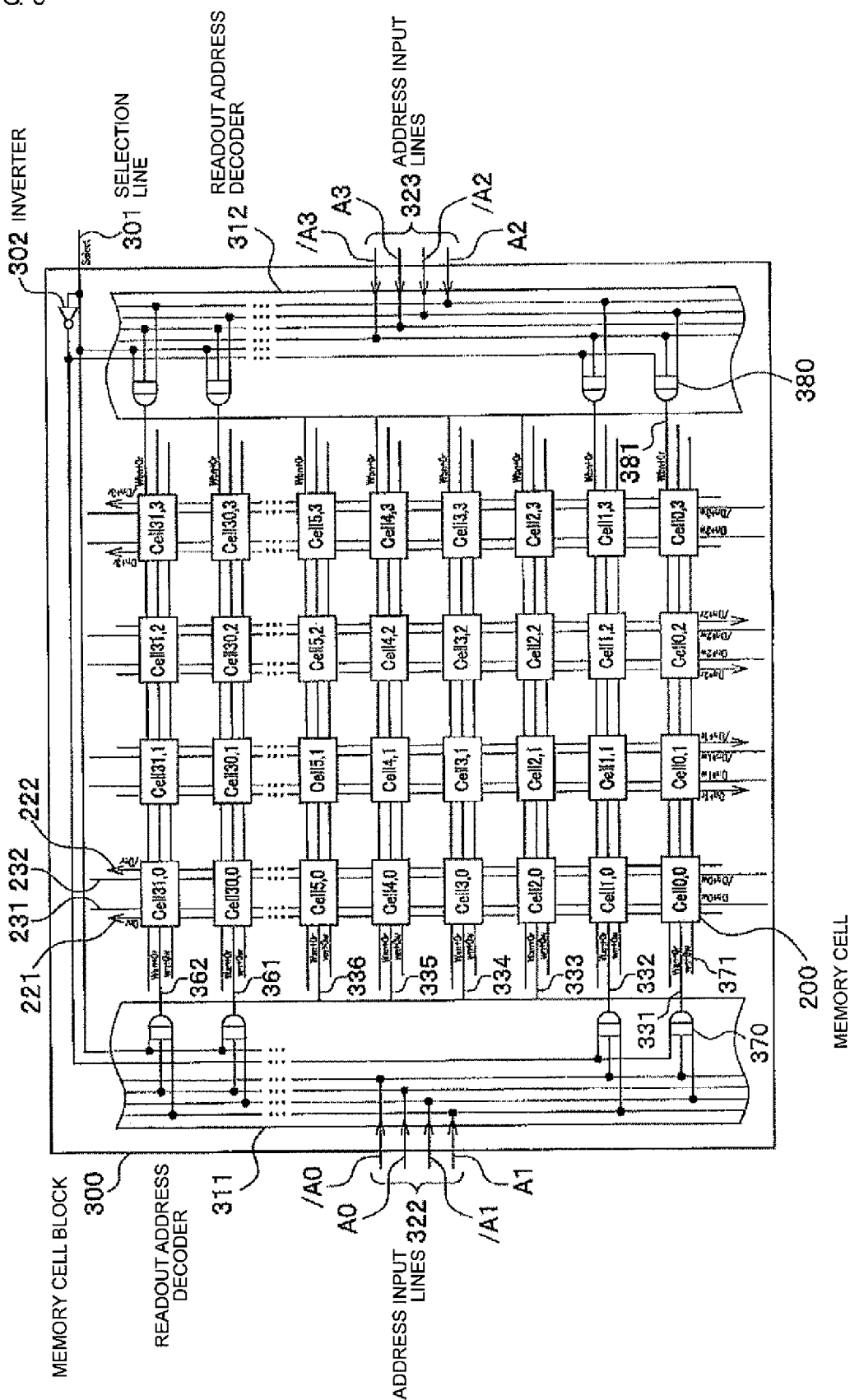
FIG. 3 is a configuration diagram of a memory cell block.

FIG. 3 is a configuration diagram of a part of memory block cells of the internal configuration of the semiconductor device 110 shown in FIG. 1 (see FIG. 2 as appropriate).

A memory cell block 300 is configured of multiple memory cells 200 disposed in an arrayed manner and connected, and readout address decoders 311 and 312. Also, as described above, readout address decoders 311 and 312 of the double readout word lines 201 and 202 are provided on both sides, whereby a wiring function described below can be included.

The memory cell block 300 is configured such that the readout data lines 221 and 222 are connected to other memory blocks 300 (not shown) at the outer memory cells 200 of the top, i.e., at the upper side of a memory cell 200 (Cell 31,0) and memory cell 200 (Cell 31,3), and at the inner memory cells 200 of the bottom, i.e., at the lower side of a memory cell 200 (Cell 0,1) and memory cell 200 (Cell 0,2).

Also, with the memory cell block 300, the readout data lines 221 and 222 are disconnected at the inner memory cells 200 of the top, i.e., at the upper side of a memory cell 200 (Cell 31,1) and memory cell 200 (Cell 31,2), and at the outer memory cells 200 of the bottom, i.e., at the lower side of a memory cell 200 (Cell 0,0) and memory cell 200 (Cell 0,3).

That is to say, with the memory cell block 300, the readout data lines are configured such that the outer multiple pairs are connected upward, and the inner multiple pairs are connected downward. Thus, the output (readout) scale of the memory cell block 300 can be suppressed to the requisite minimum, the load of various types of data processing can be reduced, and multiple outputs can be performed in multiple directions.

The readout address decoder 311 is disposed on the left side within the memory cell block 300, which receives multiple address differential signals from the address input lines 322. Also, the readout address decoder 312 is disposed on the right side within the memory cell block 300, which receives multiple address differential signals from the address input lines 323.

Note that, with the present Specification, "3" or "4" for the number of inputs and the number of outputs is equivalent to "3 pairs" or "4 pairs" in the case of a differential signal.

With the memory cell block 300, according to the inputs from the address input lines 322, address input lines 323, and selection line (particular address selection line) 301, an arbitrary line can be selected from the multiple readout word lines (corresponds to the readout word line 202 shown in FIG. 2) from the reference numeral 331 to reference numeral 362, and the voltage of the readout word line thereof can be applied.

Also, there is provided an inverter 302 on the selection line 301. Further, there are provided multiple logic circuits (AND circuits, SAND circuits, etc.) 370 at the readout address decoder 311. Also, a write word line 371 (corresponding to the write word line 211 shown in FIG. 2) is connected to a write address decoder 411 (see FIG. 5).

Note that the logic circuits and so forth of the readout address decoder 312 are similar to the case of the readout address decoder 311, so description thereof will be omitted (e.g., a logic circuit 380 is connected to a readout word line 381).

As shown in FIG. 3, for example, an arrangement is made wherein when "1" is input from the selection line 301, the upper half of the memory cells 200 of the memory cell block 300 operates, and when "0" is input from the selection line 301, the lower half of the memory cells 200 of the memory cell block 300 operates.

Accordingly, for example, if an arrangement is made wherein the upper half of the memory cells 200 of the memory cell block 300 operates as an adder, and the lower half of the memory cells 200 operates as a subtractor, switching between the adder and subtractor can be performed instantly only by switching the signal from the selection line 301. Also, in addition to this switching, switching between the adder and a common storage device, or the like can be performed in the same way.

The overall and details of the memory cell block 300 have been described so far, but thus, the memory cells 200 are configured of vertically 32×horizontally 4, whereby sense amplifiers can be omitted by shortening the readout data lines 221 and 222 (see FIG. 2), and accordingly, the circuits can be simplified.

Figure 4:
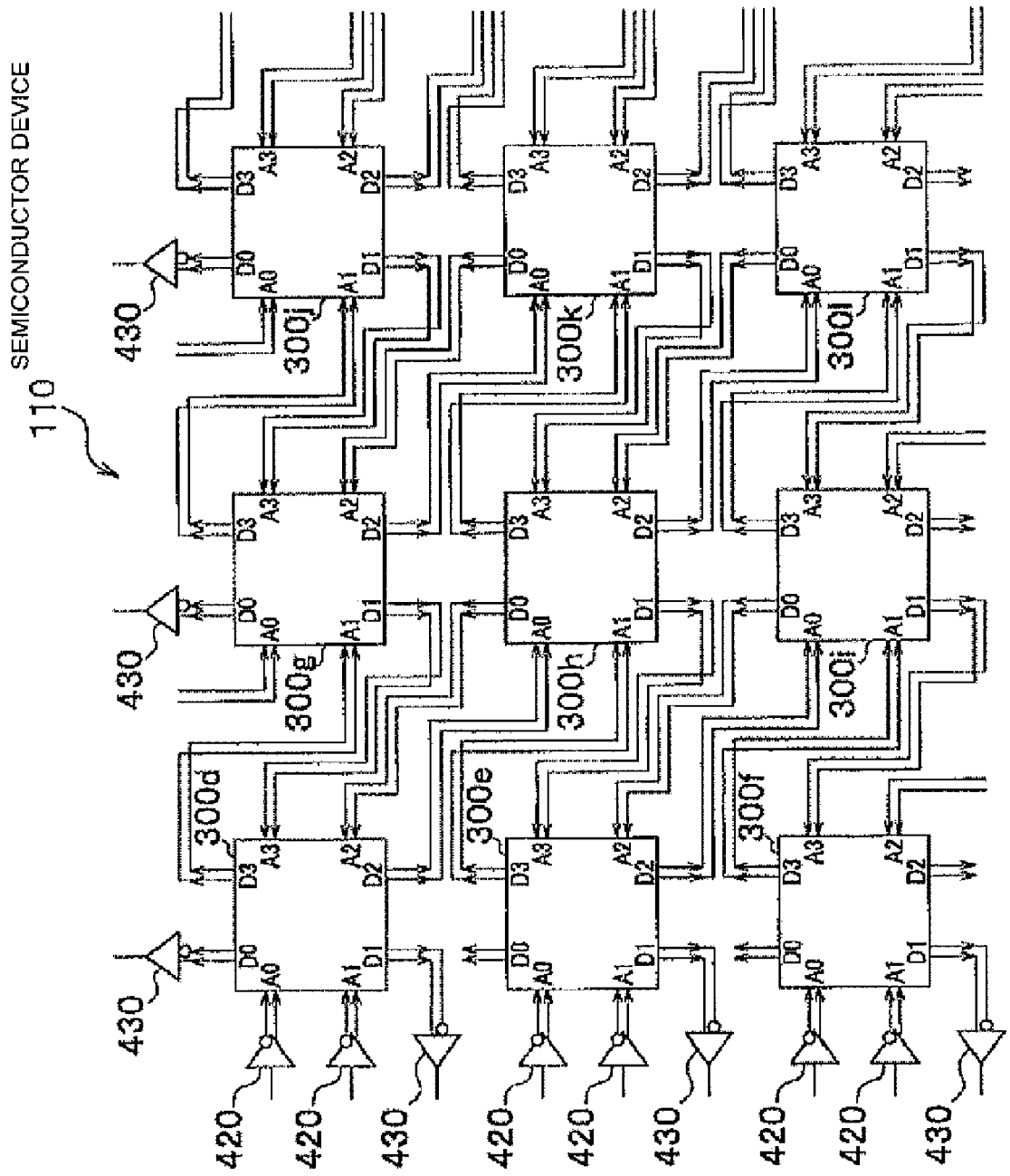
FIG. 4 is a diagram illustrating a connection situation of readout ports in the semiconductor device 110.

FIG. 4 is a diagram illustrating a connection situation of the readout ports (upward and downward two output pairs of the readout data lines and two input pairs from the address input lines 322 and 323 shown in FIG. 3) in the semiconductor device 110 (see FIG. 1). Also, FIG. 4 represents a part of the upper left in the case of plane-viewing the semiconductor device 110.

With memory cell blocks 300d through 300l, let us say that input A0 (hereafter, referred to "A0"; this is true for A1 through A3) indicates a combination of A0 and /A0 in FIG. 3 for simplifying description, which is true for A1 through A3.

Also, with memory cell blocks 300d through 300l, let us say that output D0 (hereafter, referred to "D0"; this is true for D1 through D3) indicates a combination of the two readout data lines of the memory cell 200 (Cell 31,0) shown in FIG. 3 for simplifying description, which is true for D1 through D3. The A0 through A3 and D0 through D3 of the memory cell block 300d through 300l are connected such as shown in FIG. 4.

Note that a driver circuit 420 is for converting a signal input to the present device (semiconductor device 110) from an external device into a differential signal. Also, an amplifier 430 is for amplifying an input differential signal, converting this into a common signal, and outputting this to an external device.

Providing such wiring enables the semiconductor device 110 to readily perform feedback of data. Specifically, for example, in a case wherein data is transmitted from the D3 of the memory cell block 300d to the A1 of the memory cell block 300g, a truth table is written in the memory cell block 300g beforehand so as to output the data input to the A1 of the memory cell block 300g from the D1 thereof, whereby the data thereof can be fed back to the A3 of the memory cell block 300d.

Also, the semiconductor device 110 can be operated as various types of logic circuit only by changing a truth table to be written in the memory cell blocks 300d through 300l without changing wiring. Note that the number of times and level of bending of such wiring are not particularly restricted to this FIG. 4, and can be changed as appropriate.

Figure 5:
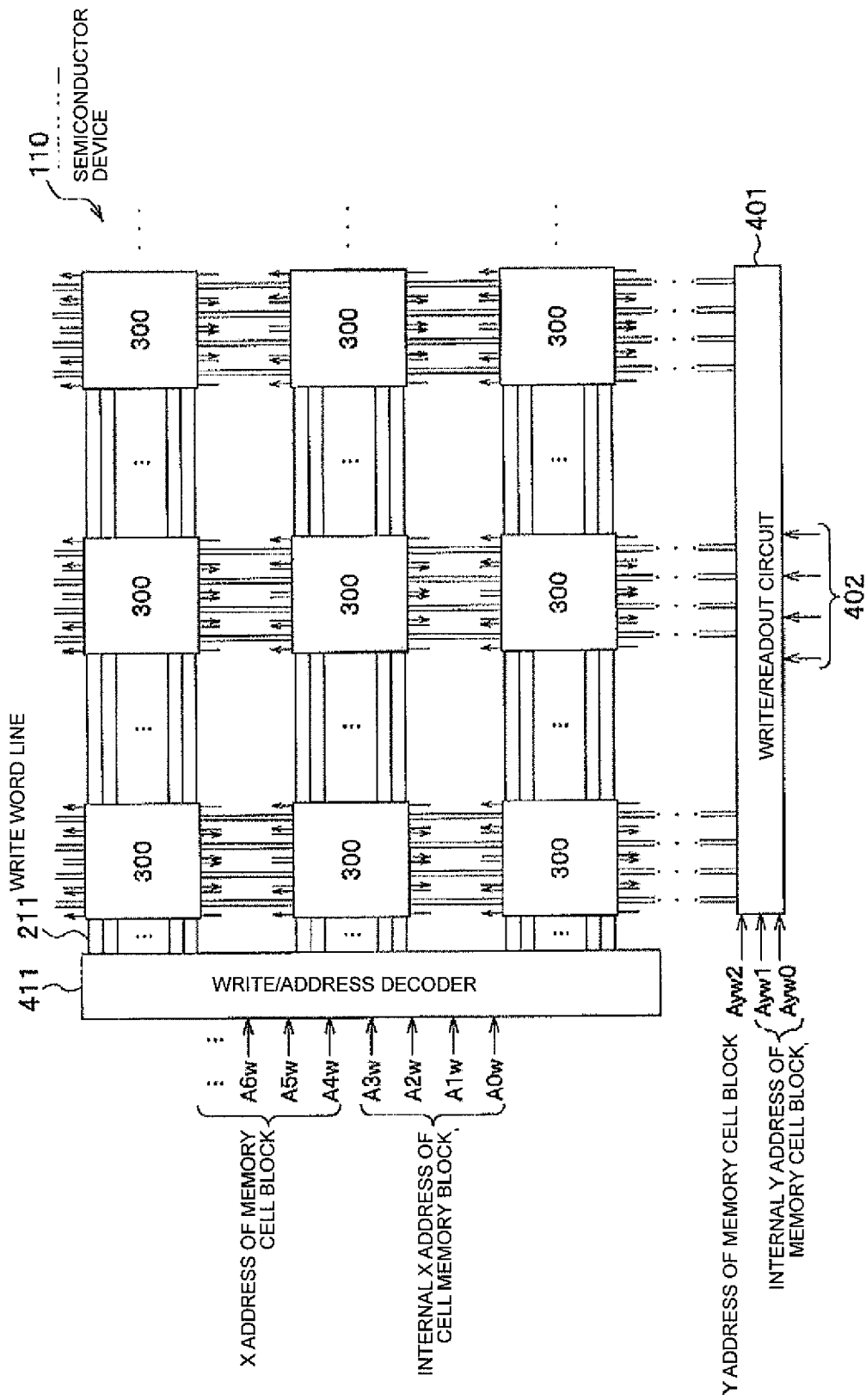
FIG. 5 is an internal configuration diagram of the semiconductor device 110.

FIG. 5 is an internal configuration diagram of the semiconductor device 110 (see FIG. 1). Each of the memory cell blocks 300 is disposed in an arrayed manner, the write address decoder 411 is disposed on the left side, and the write/readout circuit 401 is disposed on the lower side, which are connected such as shown in the drawing. That is to say, FIG. 5 is a diagram illustrating a situation other than the connection situation of the readout ports at the same semiconductor device 110 as that in FIG. 4.

The write address decoder 411 is a device for identifying the x address of the memory cell block 300 (the address in the vertical direction of the semiconductor device 110 shown in FIG. 5) at the time of writing data in a memory cell block 300.

With the write address decoder 411, an x address for identifying which memory cell block 300 of the multiple memory cell blocks 300 is input to the upper address (A4w and thereafter, A5w, A6w, and so on in this case), and an x address for identifying the inner portion (memory cell 200) of the identified memory cell block 300 thereof is input from the lower address (A0w through A3w in this case).

Also, the write/readout circuit 401 is a device for identifying the y address of the memory cell block 300 which data is read from or written in, and further, reading from or writing in the identified memory cell block 300.

Specifically, with the write/readout circuit 401, a Y address (address in the horizontal direction of the semiconductor device 110 shown in FIG. 5) for identifying which memory cell block 300 of the multiple memory cell blocks 300 is input (to Ayw2 in this case), and an y address for identifying the internal portion (memory cell 200) of the identified memory cell block 300 thereof is input (to Ayw0 and Ayw1 in this case). Also, multiple-bit (4-bit in this case) data is input to the write/readout circuit 401 from input 402.

Thus, a particular memory cell 200 of a particular memory cell block 300 is selected as appropriate, whereby rewriting of the truth table data, or the like, can be performed.

That is to say, in a case wherein of the multiple memory cell blocks 300, the truth table data stored in the memory cell 200 of a part of the memory cell blocks 300 is rewritten, the semiconductor device 110 can change operation in accordance with the rewritten truth table data.

Figure 6:
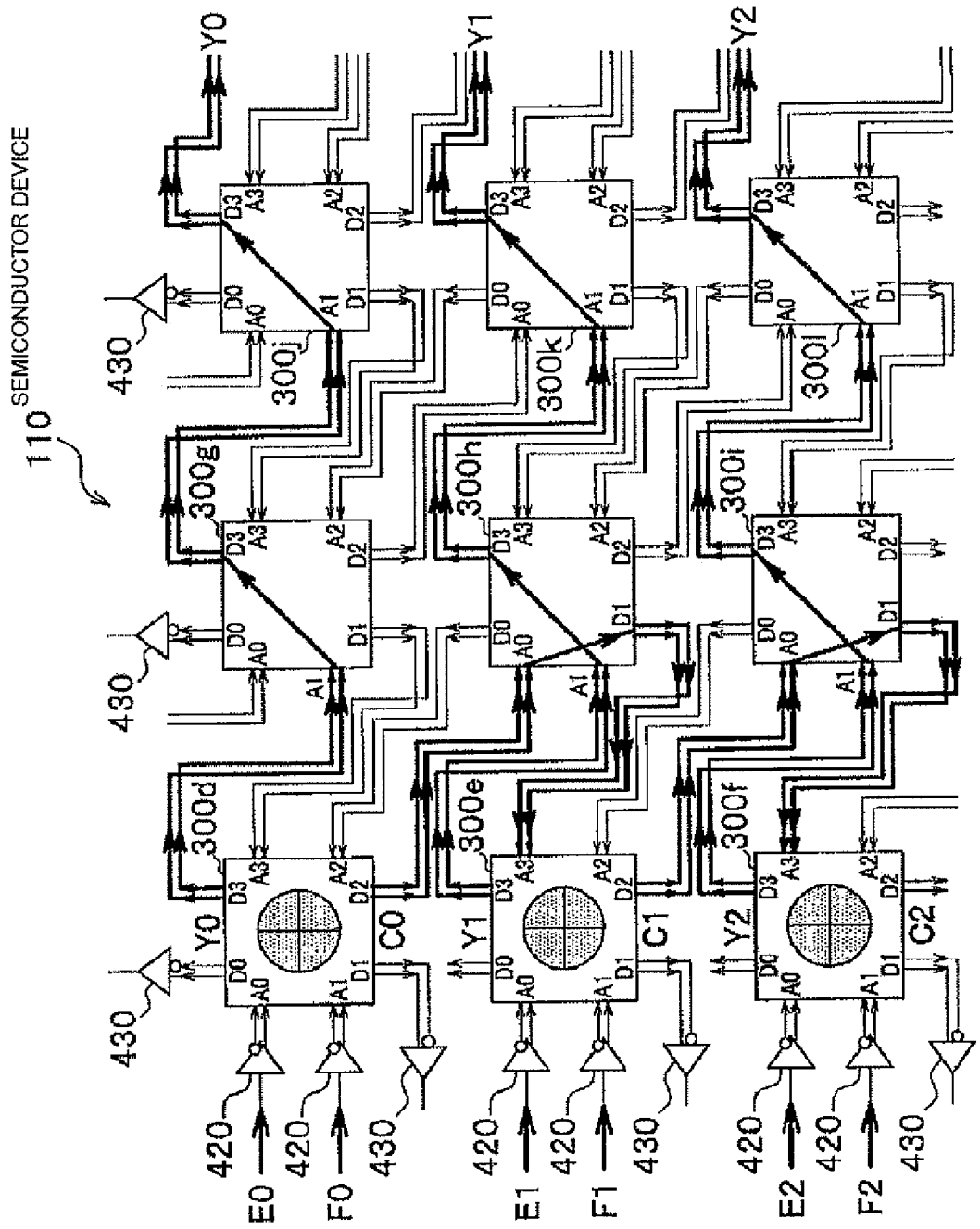
FIG. 6 is a configuration example of a 3-bit adder.

Subsequently, description will be made with reference to FIG. 6 through FIG. 9 regarding an example of the case of employing the semiconductor device 110 (see FIG. 4) as a 3-bit adder. FIG. 6 is a configuration example of the 3-bit adder. Connection between the memory cell blocks in FIG. 6 is the same as that in the case of FIG. 4.

Now, description will be made regarding a case wherein two 3-bit numerals E and F are added, and a result thereof is taken as Y. Now, let us say that the least significant bit of E is E0, the next bit is E1, and the most significant bit is E2. Also, let us say that the least significant bit of F is F0, the next bit is F1, and the most significant bit is F2. Further, let us say that the least significant bit of Y is Y0, the next bit is Y1, and the most significant bit is Y2. Also, let us say that a carry over according to addition of the least significant bit is C0, a carry over according to addition of the next bit is C1, and a carry over according to addition of the most significant bit is C2. Also, each signal is differential, but has been described in a simplified manner to simplify description.

At the memory cell block 300d, E0 is input from A0, F0 is input from A1, addition is performed, Y0 is output from D3, and C0 is output from D2. At the memory cell block 300e, E1 is input from A0, F1 is input from A1, C0 is input from A3, addition is performed, Y1 is output from D3, and C1 is output from D2. At the memory cell block 300f, E2 is input from A0, F2 is input from A1, C1 is input from A3, addition is performed, Y2 is output from D3, and C2 is output from D2.

Y0 which has been output from the D3 of the memory cell block 300d is passed through a route such as shown in the drawing, and is output from the D3 of the memory cell block 300j. Y1 which has been output from the D3 of the memory cell block 300e is passed through a route such as shown in the drawing, and is output from the D3 of the memory cell block 300k. Y2 which has been output from the D3 of the memory cell block 300f is passed through a route such as shown in the drawing, and is output from the D3 of the memory cell block 300l. Thus, Y0, Y1, and Y2 which are addition results can be obtained.

Figures 7A, 7B:
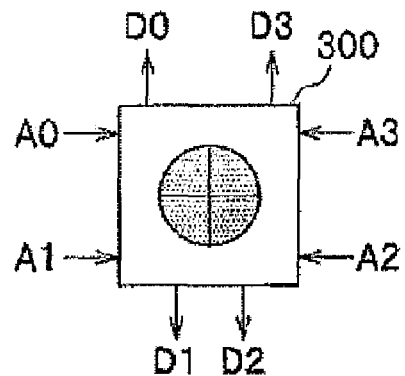
FIG. 7A is a simplified diagram of a memory cell block 300.
FIG. 7B is a truth table which is stored in memory cell blocks 300d, 300e, and 300f.

In FIGS. 7A and 7B, FIG. 7A is a simplified diagram of the memory cell block 300, and FIG. 7B is a truth table which is stored in the memory cell blocks 300d, 300e, and 300f (see FIG. 6 as necessary). As shown in FIG. 7A, at the memory cell block 300 upon input to A0 through A3 being performed, the data defined in the truth table is output from D0 through D3 in response to the inputs thereof.

As shown in FIG. 7B, upon E (E0 through E2), F (F0 through F2), and Cin (C0 through C2) being input to A0, A1, and A3, and as three addition results thereof, the bit value thereof is output to D3 as Y (Y0 through Y2), and a carry over thereof is output to D2 as Cout (C0 through C2). Note that D0 and D1 are not used here, so "0" is output to D0 and D1 in all cases.

Also, from the top, the first through fourth rows and the fifth through eighth rows are identical, and the ninth through twelfth rows and thirteenth through sixteenth rows are identical regarding the truth values other than A2, but this is for obtaining correct output results even if any data of "0" and "1" is input to A2.

Figures 8A, 8B:
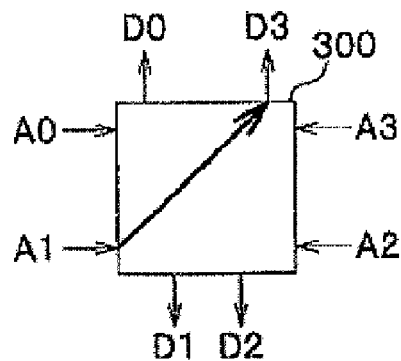
FIG. 8A is a simplified diagram of the memory cell block 300.
FIG. 8B is a truth table which is stored in memory cell blocks 300g, 300j, 300k, and 300l.

In FIGS. 8A and 8B, FIG. 8A is a simplified diagram of the memory cell block 300, and FIG. 7B is a truth table which is stored in the memory cell blocks 300g, 300j, 300k, and 300l (see FIG. 6 as appropriate).

As shown in FIG. 8A, at the memory cell block 300 upon input to A0 through A3 being performed, the data defined in the truth table is output from D0 through D3 in response to the input thereof. As shown in FIG. 8B, upon Y (Y0 through Y2) being input to A1, the value thereof is output to D3 without change. Note that D0 through D2 are not used here, so "0" is output to D0 through D2 in all cases.

Also, in reality, a truth table made up of two types (two rows worth) of "0"→"0", and "1"→"1" from A1 to D3 is needed, but a truth table made up of sixteen rows is provided so as to obtain correct output results even if any data of "0" and "1" is input to A0, A2, and A3.

Figures 9A, 9B:
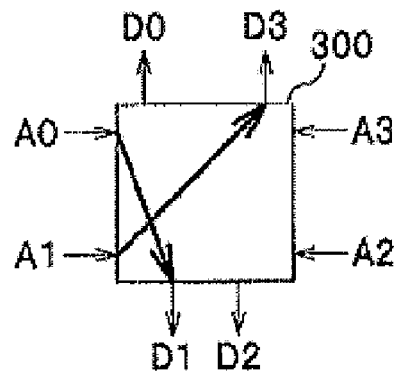
FIG. 9A is a simplified diagram of the memory cell block 300.
FIG. 9B is a truth table which is stored in memory cell blocks 300h and 300i.

In FIGS. 9A and 9B, FIG. 9A is a simplified diagram of the memory cell block 300, and FIG. 9B is a truth table which is stored in the memory cell blocks 300h, and 300i (see FIG. 6 as appropriate). As shown in FIG. 9A, at the memory cell block 300 upon input to A0 through A3 being performed, the data defined in the truth table is output from D0 through D3 in response to the input thereof.

As shown in FIG. 9B, upon C (C0 through C2) being input to A0, the value thereof is output to D1 without change. Also, upon Y (Y0 through Y2) being input to A1, the value thereof is output to D3 without change. Note that D0 and D2 are not used here, so "0" is output to D0 and D2 in all cases.

Also, in the same way as with the case of FIG. 8B, a truth table is provided so as to obtain correct output results even if any data of "0" and "1" is input to A2 and A3.

Figure 10:
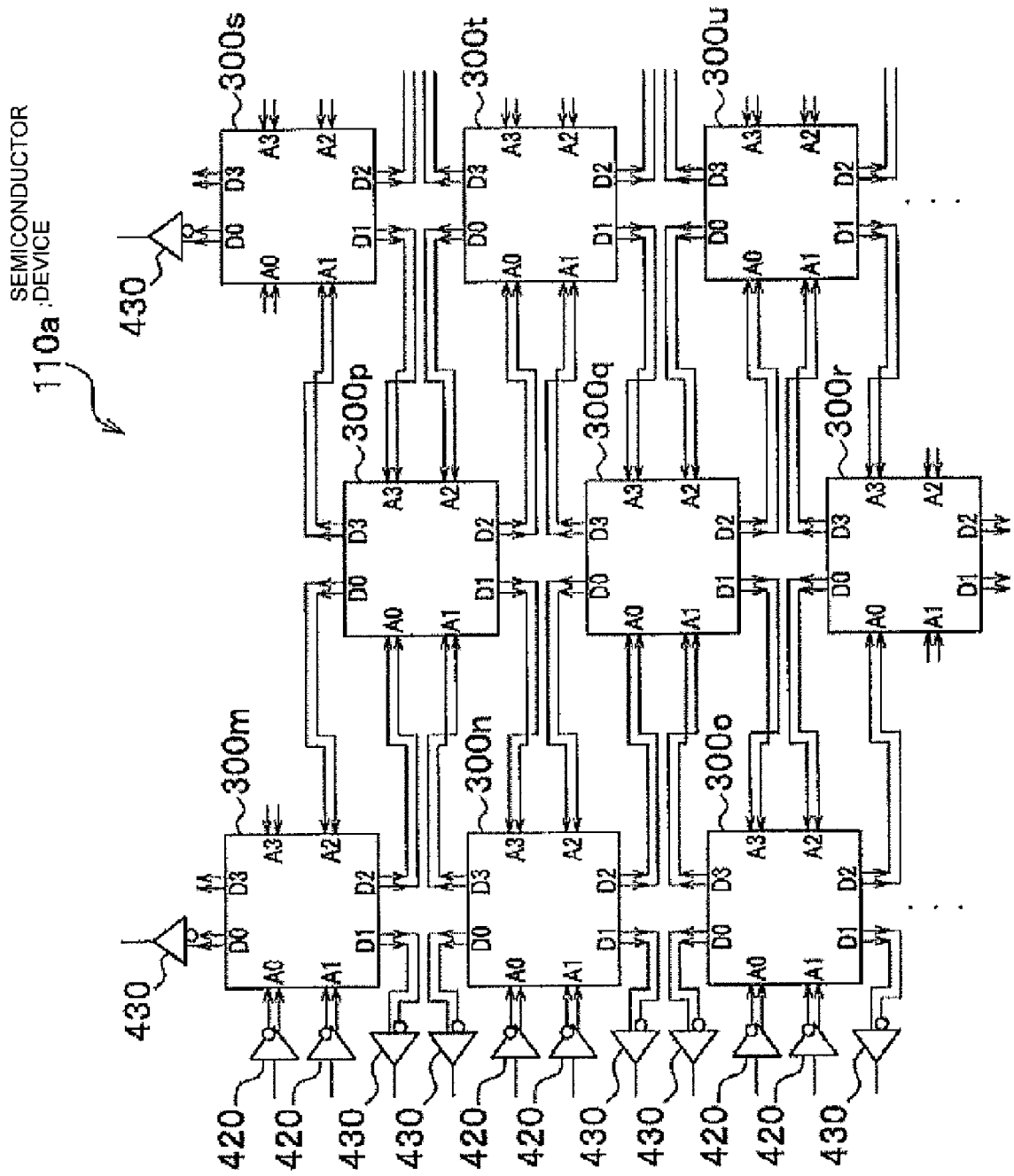

FIG. 10 is a diagram illustrating a connection situation of readout ports in a semiconductor device 110a which is a modification of the semiconductor device 110 shown in FIG. 4. With the semiconductor device 110a, as compared to memory cell blocks 300m through 300o on the leftmost column and memory cell blocks 300s through 300u on the third column from the left, memory cell blocks 300p through 300r on the column between both are disposed so as to be shifted by a half worth of a memory cell block in the vertical direction. Also, A0 through A3 and D0 through D3 of the respective memory cell blocks are connected such as shown in the drawing.

Figure 11:
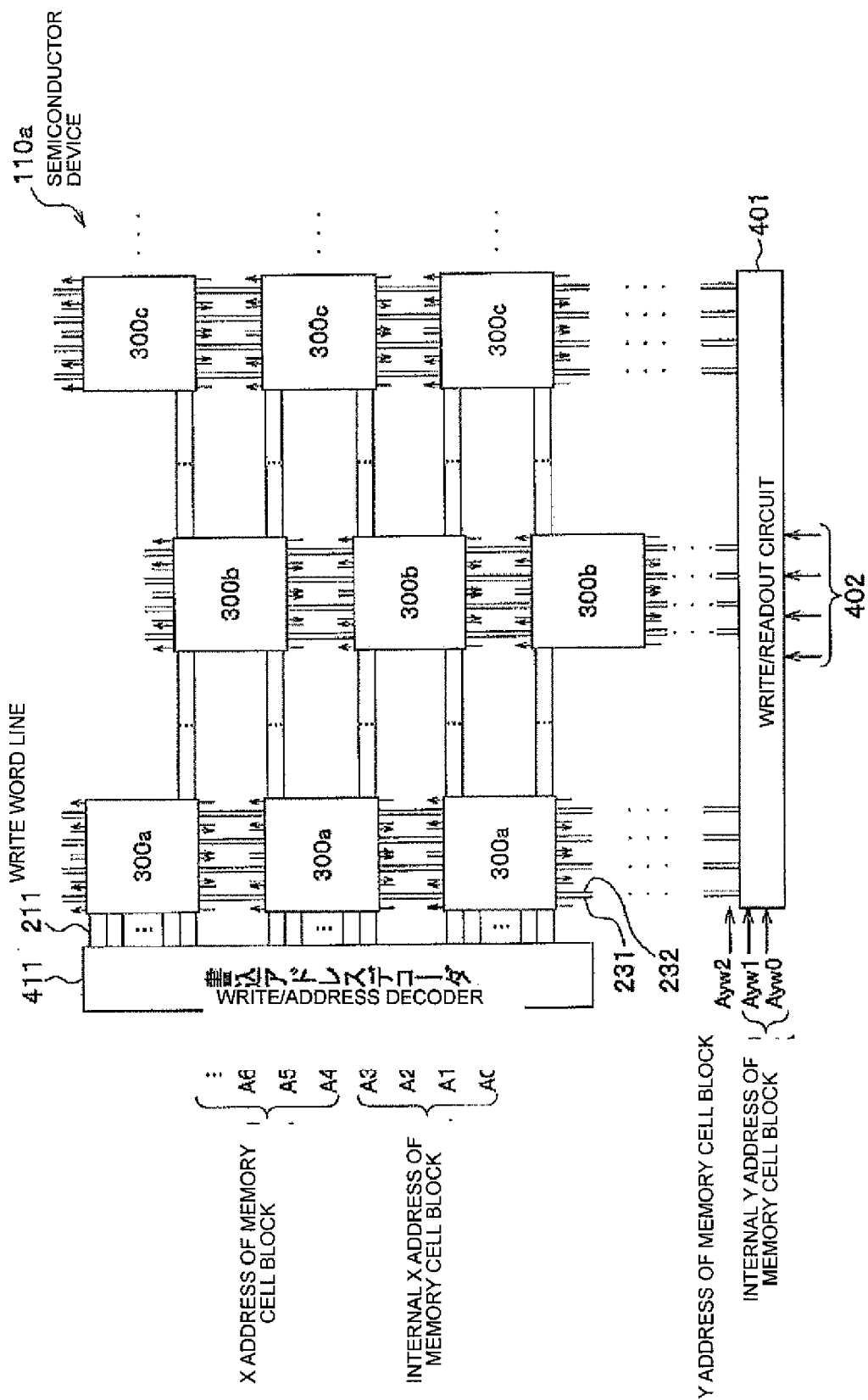

Thus, the memory cell blocks are disposed so as to be shifted, whereby the length of wiring for inputting from D0 through D3 of each memory cell block to A0 through A3 of another memory cell block can be shortened as compared to the case of the semiconductor device 110 shown in FIG. 4. Note that the number of times and level of bending of such wiring are not particularly restricted to this FIG. 10, and can be changed as appropriate. Also, the internal configuration diagram (corresponding to FIG. 5) of the semiconductor device 110a is as shown in FIG. 11.

As described above, according to the semiconductor device according to the present embodiment, with memory capable of operating as a logic circuit, output is provided to four memory cell blocks from one memory cell block, whereby feedback of data can be readily performed.

Also, with existing FPGA manufacturing, for example, a C program is created, and then an HDL (Hardware Description Language) is created. Logic synthesis is performed based on the HDL thereof to create a logic circuit. The relevant FPGA is subjected to logic placement and placement wiring based on the logic circuit thereof. That is to say, sophisticated and advanced work processes have been needed.

On the other hand, the semiconductor device according to the present embodiment is memory and storage device, whereby a C program is compiled, and the data thereof can be installed as truth values, and accordingly, work processes can be simplified and facilitated. Also, the semiconductor device according to the present embodiment is a storage device, so even in the case of realizing a different logic circuit, this can be done only by rewriting the truth table data to be written in the memory cell 200 without changing wiring.

Figure 12:
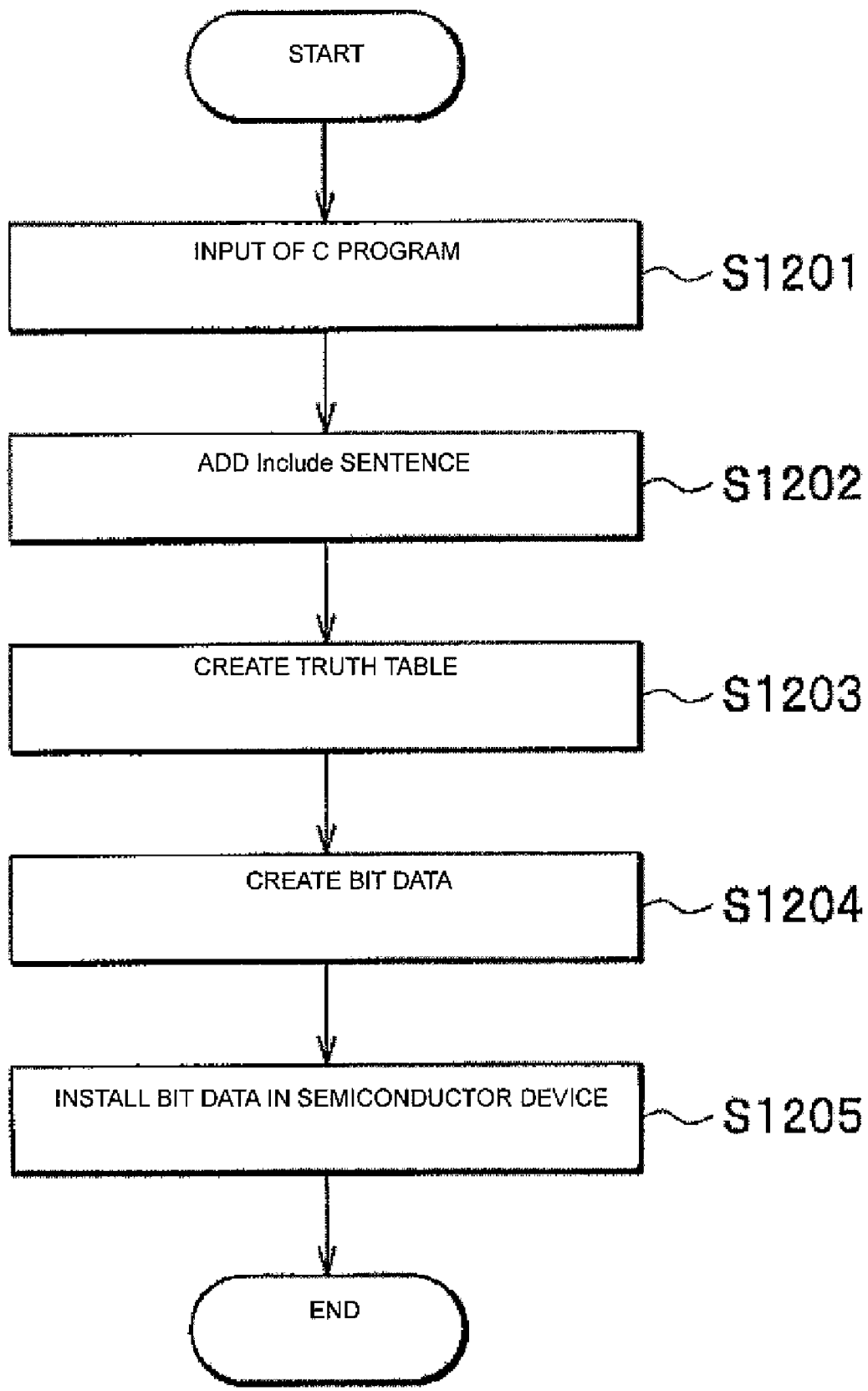
FIG. 12 is a flowchart illustrating a processing flow when installing bit data for operating as a logic circuit in a semiconductor device.

This will be described more specifically (see FIG. 1 as appropriate) with reference to FIG. 12. FIG. 12 is a flowchart illustrating a processing flow when installing bit data for operating as a logic circuit in the semiconductor device.

First, the information processing device 100 inputs a C program in which a function to be realized is described from the input unit 101 (step S1201), and stores this in the storage unit 102. Also, let us say that various functional programs (such as addition, subtraction, etc.) are stored in the storage unit 102 beforehand.

An operator of the information processing device 100 employs the input unit 101 to add a declaration statement (Include sentence) to quote a necessary portion of the programs stored in the storage unit 102 (step S1202).

The processing unit 106 creates a truth table (such as the truth table shown in FIG. 7) based on the C program to which the Include sentence has been added (step S1203), creates bit data based on the truth table thereof (step S1204), and further, installs the bit data thereof in the semiconductor device 110 through the communication unit 105 (step S1205).

Thus, according to the semiconductor device 110 of the present embodiment, a process for operating the semiconductor device 110 as a logic circuit can be simplified.

Further, according to the semiconductor device of the present embodiment, no actual logic circuit is employed, so even if a part of the memory fails, this can be readily handed (relief) by avoiding use of the failure location thereof, or the like.

Also, an arrangement wherein 32 word lines are employed as to one memory cell block, as with the present embodiment, enables attenuation of data (signals) to be suppressed without employing a sense amplifier. Note however, when placing great importance on the function of the semiconductor device, there may be provided a readout sense amplifier or intermediate buffer on a readout data line, and 33 or more word lines.

Further, according to the semiconductor device relating to the present embodiment, a plurality of memory is employed, and a test program is stored in a part thereof, whereby another piece of memory can be tested. Subsequently, after completion of the test, the test program is eliminated from the memory in which the test program has been stored, whereby such memory can be employed common memory.

Also, with a system LSI including memory, the memory thereof is configured so as to have the configuration of the semiconductor device according to the present embodiment, a self-test is performed, and the memory portion thereof is described with a test program described in C language to configure a test logic circuit, whereby another logic circuit of the system LSI can be tested.

Further, connection between memory cell blocks is not restricted to the case of one memory cell block being connected to other four memory cell blocks, and another arrangement may be made wherein one memory cell block is connected to other three or more memory cell blocks so as to perform feedback of data.

Further, the readout data lines are differential, but in light of a semiconductor layout or the logic circuit of the readout address decoder, wiring may be performed only by the readout data lines on one side.

Figure 13:
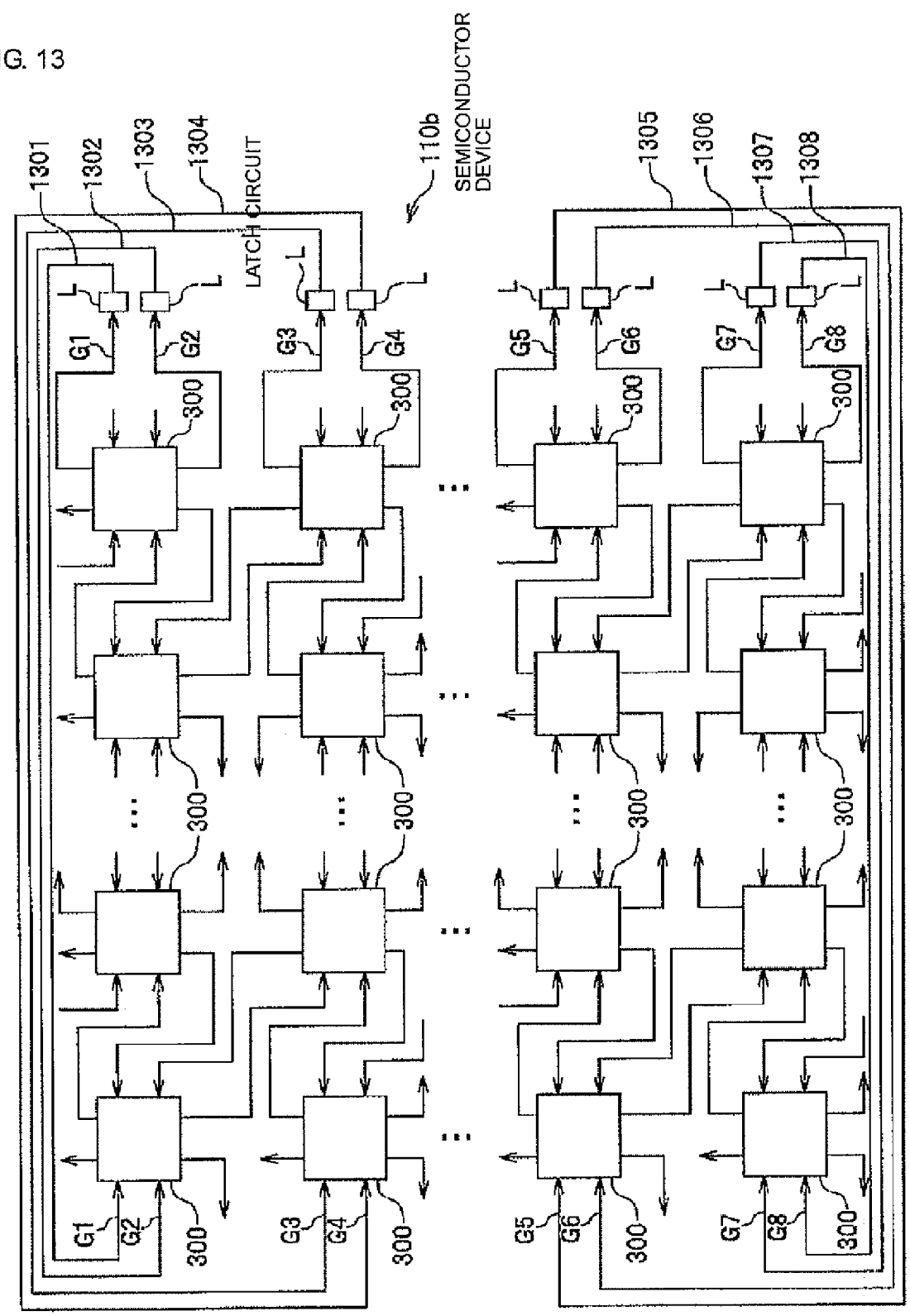
FIG. 13 is a schematic diagram of a semiconductor device having a configuration whereby consecutive operation can be performed.

Next, description will be made regarding a semiconductor device having a configuration capable of consecutive operation with reference to FIGS. 13 through 15. FIG. 13 is a schematic diagram of a semiconductor device having such a configuration.

The semiconductor device 110b shown in FIG. 13 has a configuration wherein the memory cell blocks 300 are disposed in an arrayed manner, in the same way as with the semiconductor device 110 shown in FIGS. 4 through 6, but in FIG. 13 description has been simplified as compared to FIG. 4 and others. The difference as to the semiconductor device 110 in FIG. 4 and others is in that there are provided latch circuits L for temporarily holding outputs G1 through G8 from the memory cell block 300 on the rightmost column, and wiring 1301 through 1308 for feeding the output held at the latch circuits L back to the memory cell block 300 on the leftmost column.

Figure 14:
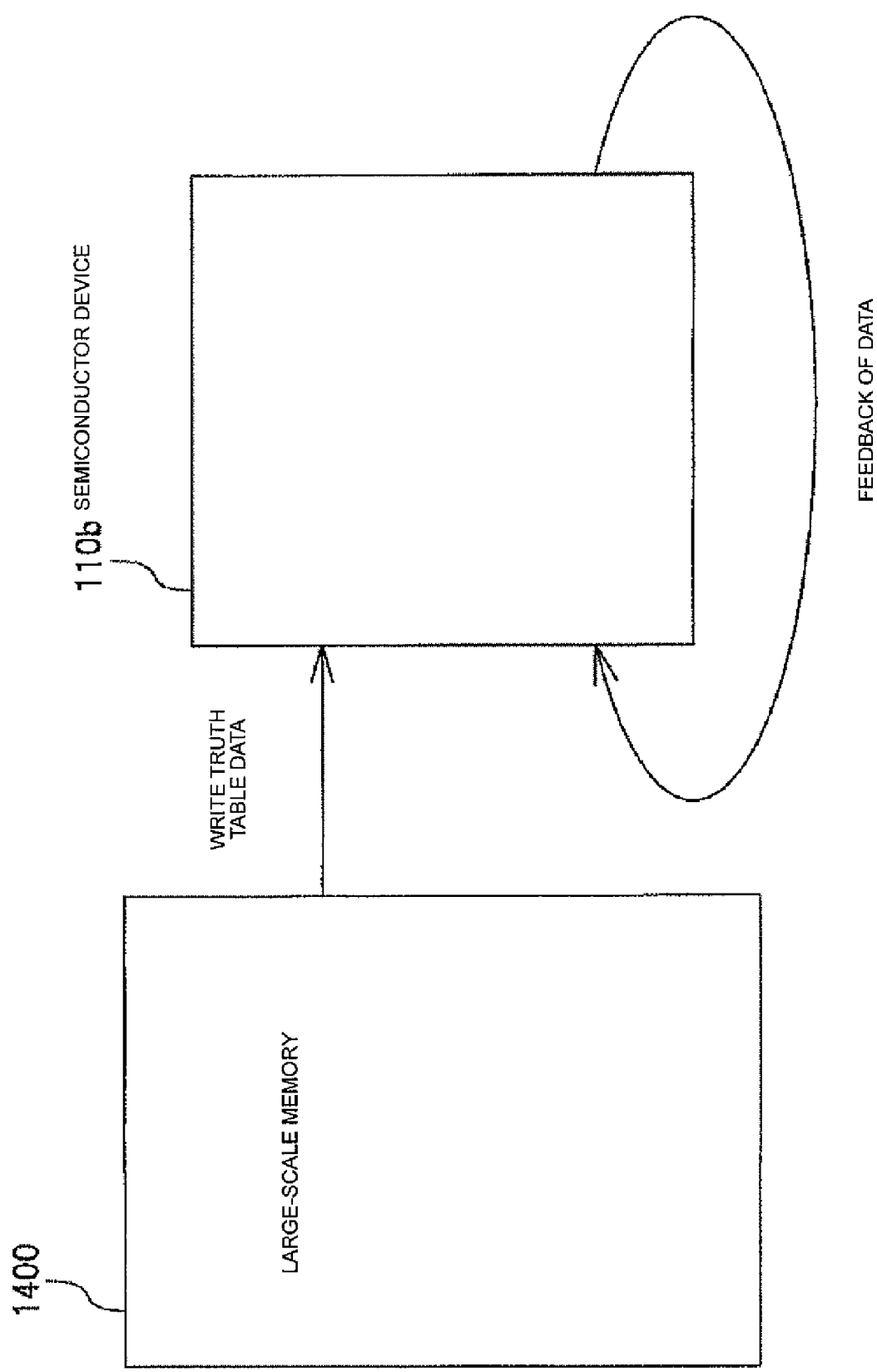
FIG. 14 is a schematic diagram illustrating the configuration of large-scale memory and semiconductor device 110b.
Figure 15:
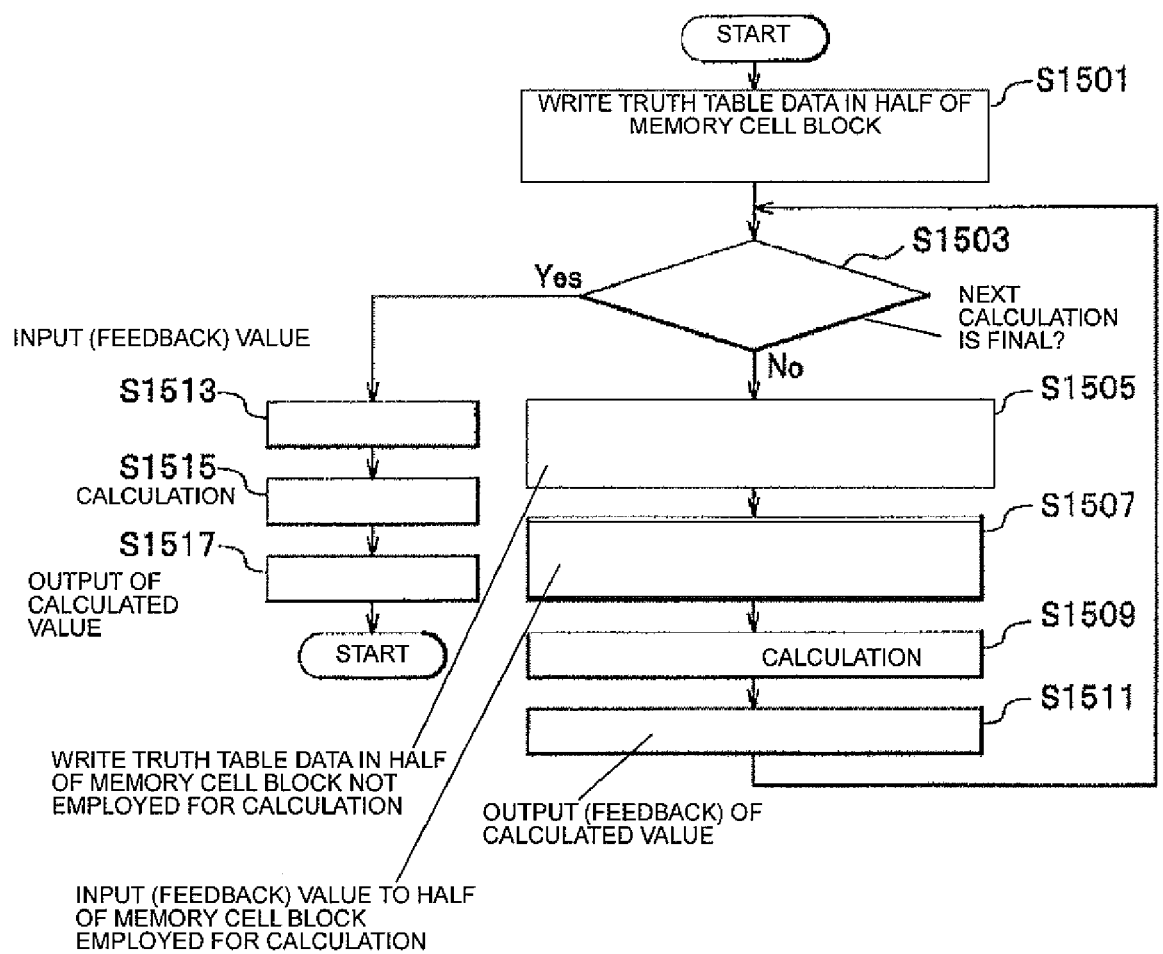
FIG. 15 is a flowchart illustrating an operation flow of the semiconductor device 110b.

FIG. 14 is a schematic diagram illustrating a large-scale memory and the configuration of the semiconductor device 110b shown in FIG. 13. Large-scale memory 1400 is a storage device in which a C program or the like has been recorded, and can be realized with, for example, ROM.

The semiconductor device 110b repeatedly performs writing of the truth table data (see the truth table shown in FIG. 7) made up of the C program from the large-scale memory 1400, calculation according to the truth table data thereof, and feedback of output thereof (calculation results), but the details thereof will be described below with reference to FIG. 15 (see FIGS. 13 and 14 as appropriate). FIG. 15 is a flowchart illustrating an operation flow of the semiconductor device 110b.

First, the truth table data of the large-scale memory 1400 is written in the semiconductor device 110b (step S1501). The truth table data of the large-scale memory 1400 is, as described with reference to FIG. 3, written in the upper half or lower half of each of the memory cell blocks 300 of the semiconductor device 110b.

Subsequently, in a case wherein the calculation to be performed next (calculation based on the truth table data according to each memory cell block 300) is not final (No in step S1503), i.e., when the semiconductor device 110b still needs to perform calculation after the next calculation and thereafter according to the C program in the large-scale memory 1400, the processing proceeds to the processing in step S1505 and thereafter.

In step S1505, the truth table data from the large-scale memory 1400 is written in the opposite (remaining) half (upper half or lower half) of the half to be performed from now in each memory cell block 300 of the semiconductor device 110b.

Also, processing in steps S1507 through S1511 is performed in parallel with the processing in step S1505. That is to say, with the semiconductor device 110b, the value (the value provided from the large-scale memory 1400 at the first calculation, and the value fed back from the latch circuit L at the second calculation and thereafter) is input to each memory cell block 300 on the leftmost column in FIG. 13 (step S1507), calculation is performed using the upper half or lower half of each memory cell block 300 in which the truth table data has been written in step S1501 (step S1509), the value calculated from each memory cell block 300 on the rightmost column in FIG. 13 is output (step S1511), and the processing returns to step S1503.

In a case wherein the calculation to be performed next is final (Yes in step S1503), i.e., when the semiconductor device 110b does not need to perform calculation after the next calculation and thereafter by the C program in the large-scale memory 1400, in steps S1513 through S1517 the same processing as that in steps S1507 through S1511 is performed, and the output thereof is transmitted to a predetermined device (not shown) as computation results, and the processing ends.

Thus, according to the semiconductor device 110b shown in FIG. 13, calculation in the memory cell 200 of the upper half or lower half (the switching thereof is according to the selection line 301 shown in FIG. 3) of each memory cell block 300, rewriting of the truth table data of the half (upper half or lower half of each memory cell block 300) wherein calculation is not performed in parallel therewith, and feedback of output (calculation results) are performed, whereby consecutive calculation can be performed, and accordingly, the overall of the C program recorded in the large-scale memory 1400 can be operated consecutively.

Figure 16:
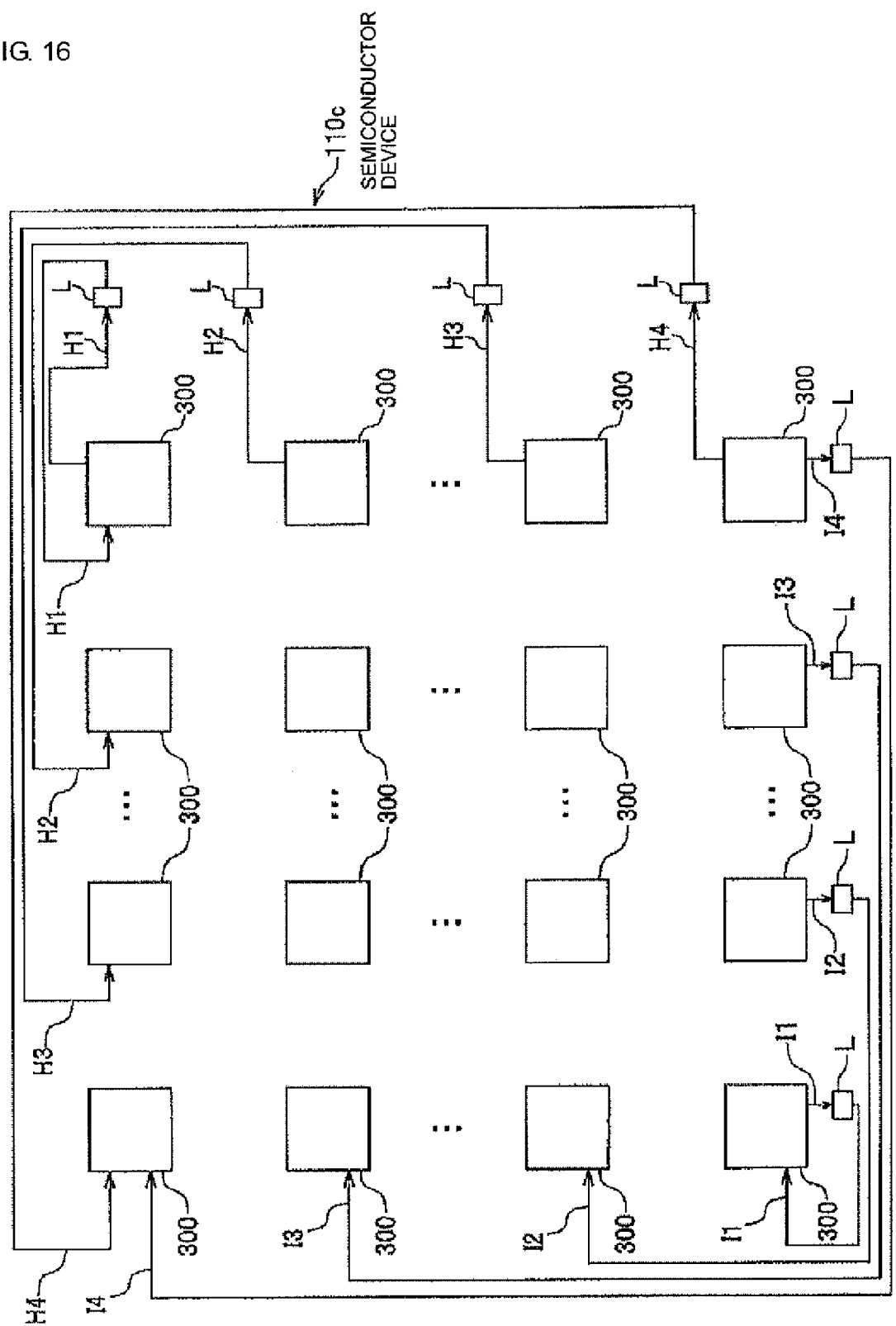
FIG. 16 is a schematic diagram of a modification of the semiconductor device.

Next, description will be made with reference to FIG. 16 regarding a modification of the semiconductor device capable of consecutive operation by performing feedback of output (calculation results). FIG. 16 is a schematic diagram of the semiconductor device according to the modification thereof.

The semiconductor device 110c shown in FIG. 16 has generally the same configuration as the semiconductor device 110b shown in FIG. 13, but differs, as compared to the semiconductor device 110b shown in FIG. 13 which inputs output from the memory cell block 300 on the rightmost column to the memory cell block 300 on the leftmost column to subject this to feedback, in that the output from the memory cell block 300 on the rightmost column is input to the memory cell block 300 on the top row to subject this to feedback, and the output from the memory cell block 300 on the bottom row is input to the memory cell block 300 on the leftmost column to subject this to feedback. Thus, as compared to the case in FIG. 13, flexibility of the number of logic circuit stages can be improved.

Thus, a feedback route suitable for output can be selected according to a calculation type (addition, multiplication, etc.) or the like, and can be employed.

Also, though not shown in the drawing, in the same way as with the semiconductor device 110b shown in FIG. 13 and the semiconductor device 110c shown in FIG. 16, with the semiconductor device 110, the output from the memory cell block 300 on the bottom row may be input to the memory cell block 300 on the top row to subject this to feedback.

Figure 17:
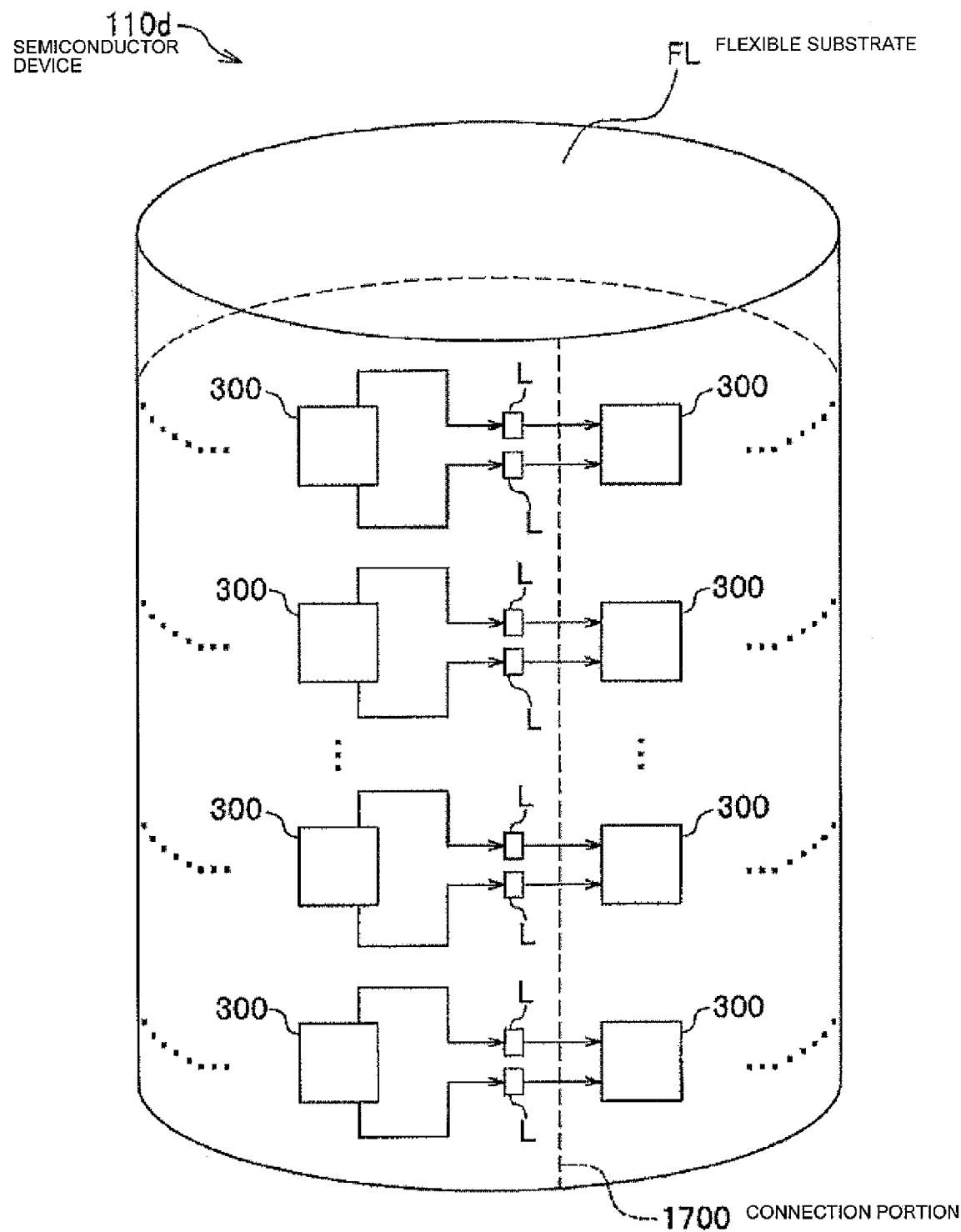
FIG. 17 is a configuration diagram of a semiconductor device employing a flexible substrate.

Next, description will be made regarding a semiconductor device employing a flexible substrate with reference to FIG. 17. FIG. 17 is a configuration diagram of a semiconductor device employing a flexible substrate.

With a flexible substrate FL making up the substrate of a semiconductor device 110d, an organic semiconductor having flexibility is employed as a material, such as pentacene (organic molecule wherein five benzenes are condensed).

The semiconductor device 110d is configured in a cylindrical shape so as to reduce the distance between each memory cell block 300 on the rightmost column and each memory cell block 300 on the leftmost column in the semiconductor device 110b shown in FIG. 13, and can perform feedback of output by straddling a connection portion 1700 in the same way as with the case of the semiconductor device 110b.

Figure 18:
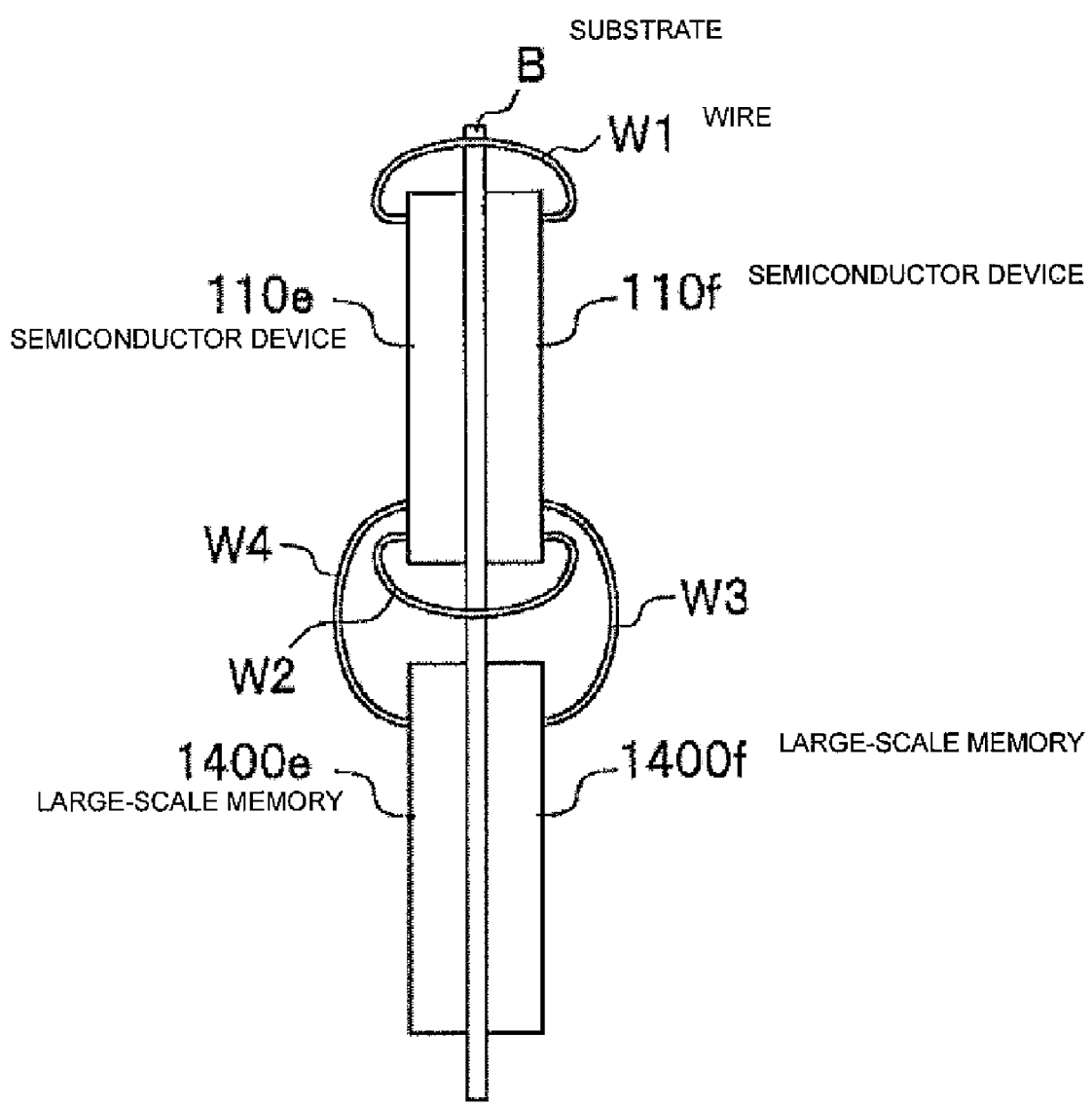
FIG. 18 is an overall configuration diagram of a semiconductor device or the like for performing feedback of output by wire bonding.

Next, description will be made with reference to FIG. 18 regarding a semiconductor device for performing feedback of output by wire bonding. FIG. 18 is an overall configuration diagram of the semiconductor device and so forth in that case.

As shown in FIG. 18, there are provided semiconductor devices 110e and 110f, and large-scale memory 1400e and 1400f on both sides of a substrate B. Also, signal transmission wires W1 through W4 are connected such as shown in the drawing.

According to such a configuration, truth table data can be written in the semiconductor device 110e from the large-scale memory 1400e by the wire W4, truth table data can be written in the semiconductor device 110f from the large-scale memory 1400f by the wire W3, and further, feedback of output can be performed between the semiconductor devices 110e and 110f by the wires W1 and W2.

Figure 19:
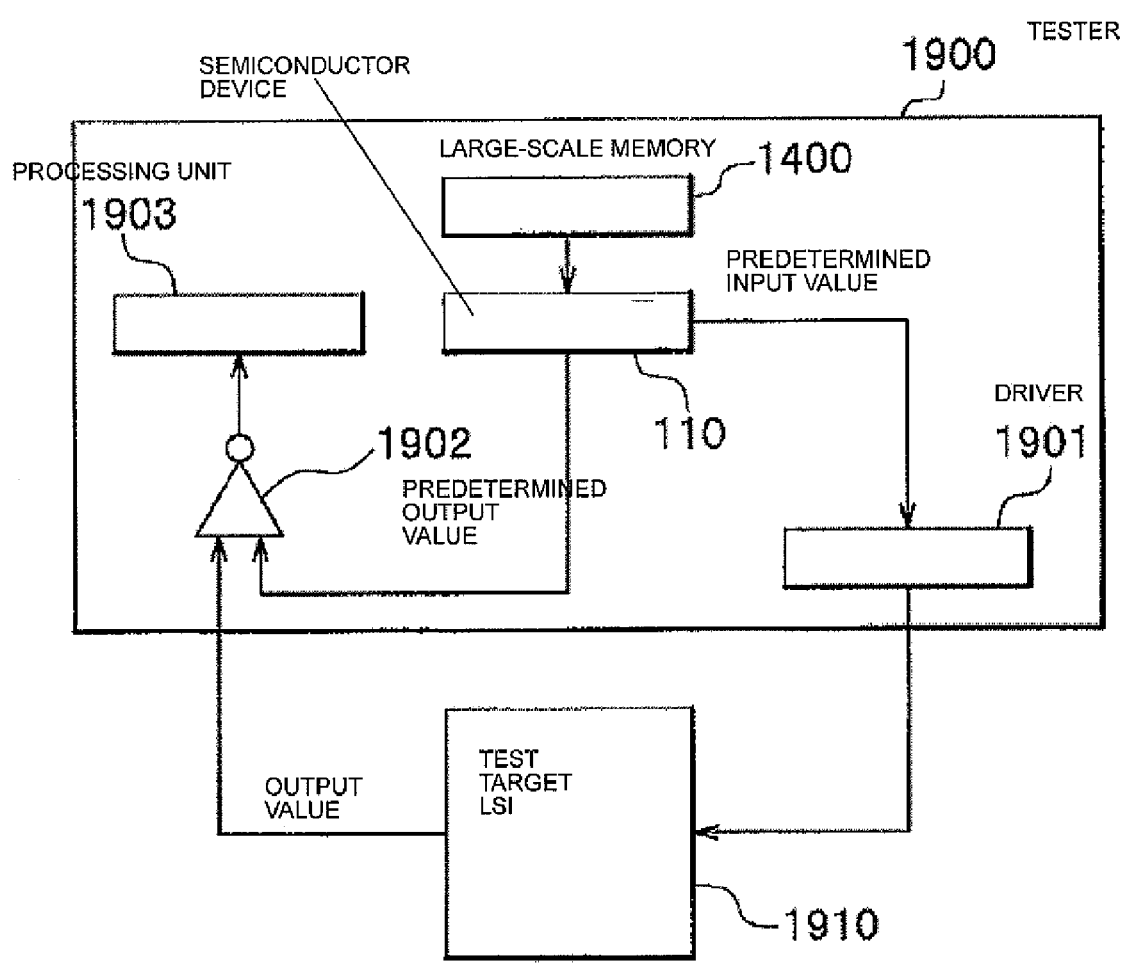
FIG. 19 is a configuration diagram of a tester and so forth.

Next, description will be made with reference to FIG. 19 regarding a case wherein the semiconductor device is employed as a tester. FIG. 19 is a configuration diagram of the tester and so forth. Note that a tester 1900 is a device for performing operation confirmation of a test object LSI 1910 (another semiconductor device).

The tester 1900 is configured of large-scale memory 1400 (storage device), semiconductor device 110, driver 1901, comparator 1902, and processing unit 1903.

The driver 1901 is a driving circuit wherein when receiving a predetermined input value from the semiconductor device 110, a signal based on the predetermined input value is transmitted to the test object LSI 1910.

The comparator 1902 is for comparing the predetermined input value from the semiconductor device 110 with the output value from the test object LSI 1910.

The processing unit 1903 is a device for receiving the output from the comparator 1902, and performing processing, and is realized by a CPU (Central Processing Unit) for example.

Also, though not shown in the drawing, the tester 1900 includes a DC power source, timing generator, and so forth as necessary. Thus, the semiconductor device 110 can be applied to the tester 1900.

Next, description will be made with reference to FIG. 20 regarding the specific configuration of the logic circuit 370 shown in FIG. 3. In FIGS. 20A through 20D, FIG. 20A is a configuration diagram of a common CMOS, FIG. 20B is a configuration diagram in a case wherein a CMOS is separated, FIG. 20C is a configuration diagram of a NAND circuit employing a common CMOS, and FIG. 20D is a configuration diagram of a NAND circuit according to an embodiment of the present invention.

As shown in FIG. 20A, a common CMOS 2000 is configured of one each of a P-MOS 2001 and an N-MOS 2002. On the other hand, the separated CMOS 2010 shown in FIG. 20B differs from the common CMOS 2000 in that the right sides (output portions) of a P-MOS 2011 and N-MOS 2012 are separated.

Also, the logic circuit 370 (NAND circuit or the like) shown in FIG. 3 can be configured, for example, by employing the N-MOS portion of the common CMOS 2000, such as shown in FIG. 20C. A, B, and C are input contact points, and P-MOS 2021, 2031, and 2041, and N-MOS 2022, 2032, and 2042 are connected such as shown in the drawing.

On the other hand, with an embodiment of the present invention, the logic circuit 370 (NAND circuit) shown in FIG. 3 can be configured, for example, by employing the separated CMOS 2010, such as shown in FIG. 20D. A, B, and C are input contact points, and N-MOS 2052, 2062, and 2072 are connected such as shown in the drawing.

Thus, the logic circuit 370 (NAND circuit) shown in FIG. 3 is configured such as shown in FIG. 20D, whereby the number of transistors (P-MOS, N-MOS) can be reduced to half as compared to the case shown in FIG. 20C, and thus, the area, volume, and so forth per one memory cell block 300 can be reduced.

Figure 21:
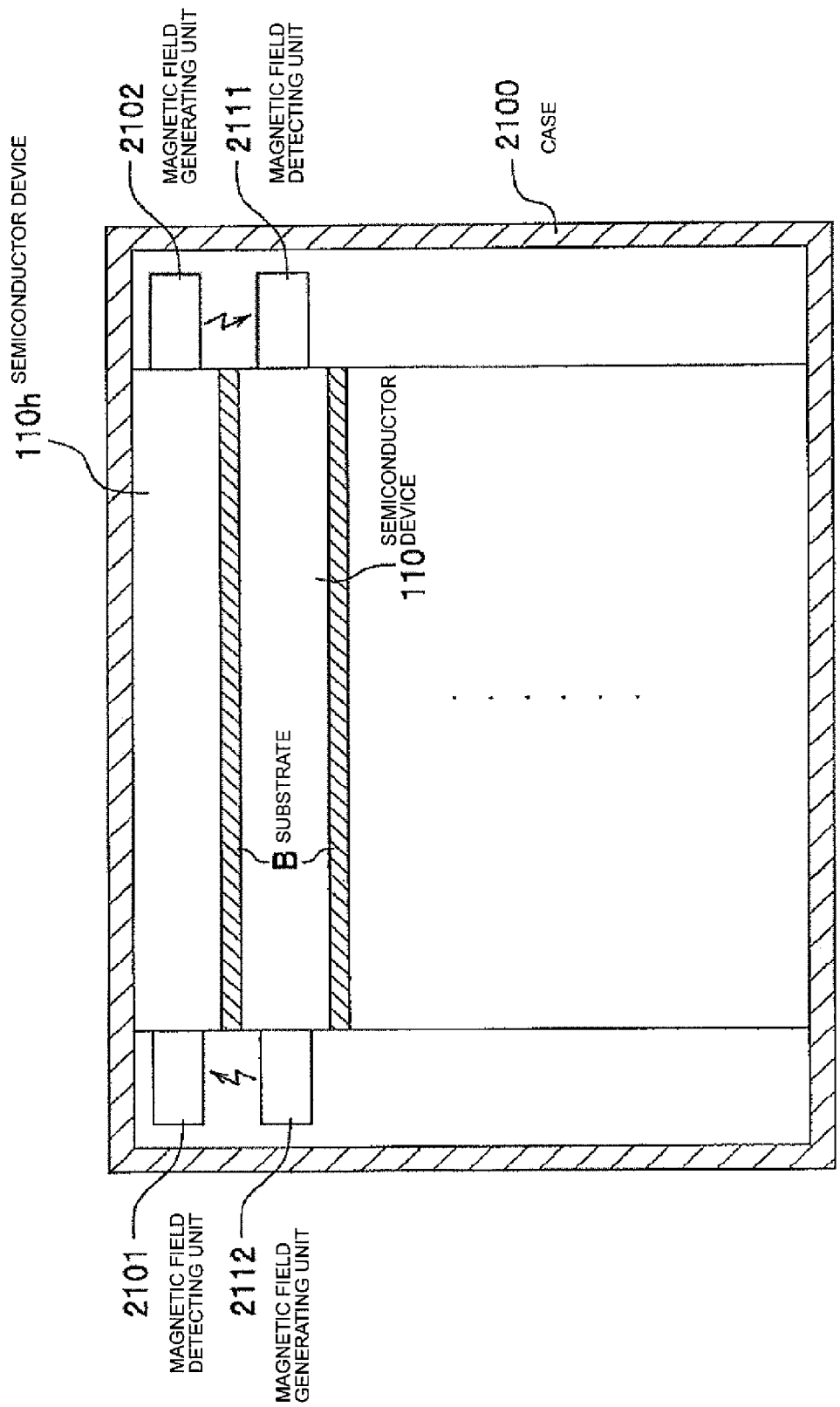
FIG. 21 is a configuration diagram of a semiconductor device and so forth in the case of performing magnetic field connection.

Next, description will be made with reference to FIG. 21 regarding a case wherein feedback of output of a semiconductor device is performed by magnetic field connection. FIG. 21 is a configuration diagram of a semiconductor device and so forth in the case of performing magnetic field connection. As shown in FIG. 21, semiconductor devices 110h, 110i, and so on are disposed within a case 2100, which each sandwich a substrate B.

Also, magnetic field detecting units 2101 and 2111, and magnetic field generating units 2102 and 2112, which are configured of a coil, transistor, and so forth, are provided on both sides of the semiconductor device 110h and 110i. The magnetic field generated at the magnetic field generating unit 2102 is received at the magnetic field detecting unit 2111, and the magnetic field generated at the magnetic field generating unit 2112 is received at the magnetic field detecting unit 2101, whereby feedback of output can be performed between the semiconductor devices 110h and 110i.

Thus, magnetic field connection according to a magnetic field generating unit and magnetic field detecting unit is employed, whereby feedback of output in the semiconductor device 110 can be performed without being bothered with a time and effort problem due to wiring, and a space problem.

This concludes description of the embodiments, but it should be noted that the embodiments of the present invention are not restricted to these. For example, the semiconductor device according to an embodiment of the present invention may be realized by employing DRAM (Dynamic Random Access Memory) or flash memory instead of SRAM. Also, the present Specification does not restrict function installation such as a precharge function for improvement in performance at memory.

In addition, modifications may be made as appropriate without departing from the essence of the present invention.

What is claimed is:

1. A semiconductor device comprising:
   a plurality of memory cell blocks including a plurality of memory cells for storing a predetermined amount of data;
   wherein each of said memory cell blocks having three or more inputs and three or more outputs includes two readout address decoders as to said memory cells internally, stores truth table data for outputting a desired logical value as to predetermined address input, and is configured so as to operate as a logic circuit;
   and wherein said memory cells include two readout word lines corresponding to said two readout address decoders, and in the case of the voltage of both of the two readout word lines being applied, the data held at this time is read out from readout data lines;
   and wherein between said memory cell blocks is connected such that the three or more outputs from one memory cell block are input to three or more other memory cell blocks.

2. The semiconductor device according to claim 1, wherein said memory cell blocks have four inputs and four outputs;
   and wherein between said memory cell blocks is connected such that the four outputs from one memory cell block are input to four other memory cell blocks.

3. The semiconductor device according to claim 1, wherein a plurality of said memory blocks each have a rectangular shape of the same size, and connection between said memory cell blocks is performed by shifting and disposing at least a part of an arrayed placement thereof.

4. The semiconductor device according to claim 1, wherein a plurality of said memory blocks are disposed in an arrayed manner, and connection between said memory cell blocks is performed by wiring.

5. The semiconductor device according to claim 4, wherein the memory cells of said memory cell blocks operate as common storage devices when said truth table data is not stored therein.

6. The semiconductor device according to claim 5, wherein, with said memory cell blocks, the areas of said memory cells which operate are divided to two;
   and wherein said areas of said memory cells which operate are switched when a specific address selection line of said readout address decoder is switched, and either operation as two types of logic circuits, or operation as a logic circuit and operation as a common storage device is switched instantly.

7. The semiconductor device according to claim 6, wherein there is provided wiring for inputting output from each of said memory cell blocks of one of the rightmost column, leftmost column, uppermost row, and lowermost row to each of said memory cell blocks of one of the others, of said memory cell blocks disposed in an arrayed manner, thereby performing feedback of data.

8. The semiconductor device according to claim 7, wherein, of the areas divided into two of said memory cells, when one of the areas operates as a logic circuit, truth table data for the next calculation is written in the other area;
   and wherein calculation according to the other area is performed by switching said specific address selection line, and calculation is performed consecutively by writing of the truth table data and switching of said specific address selection line.

9. The semiconductor device according to claim 7, wherein a flexible substrate having flexibility as a substrate is employed, and the flexible substrate thereof is bent, thereby shortening the distance of wiring for feedback of data.

10. The semiconductor device according to claim 7, wherein said semiconductor device is provided on both faces of a substrate one at a time, and feedback of data is performed by wire bonding.

11. The semiconductor device according to claim 7, which is employed as a tester for performing operation confirmation of another semiconductor device, and based on a test program for performing said operation confirmation, which is stored in a storage device provided in said tester, executes the test program thereof.

12. A semiconductor device comprising:
    a plurality of the semiconductor devices according to claim 7;
    wherein each of said semiconductor devices includes
    a magnetic field generating unit for generating a magnetic field, and
    a magnetic field detecting unit for detecting a magnetic field;
    and wherein a magnetic field is generated by said magnetic field generating unit based on the output from said memory cell blocks of one of said semiconductor devices, and the magnetic field thereof is detected by said magnetic field detecting unit of one of said other semiconductor devices, thereby performing feedback of data.

13. The semiconductor device according to claim 1, further comprising:
    a write address decoder, which is connected to a plurality of said memory cell blocks, configured to specify an x address relating to a plurality of memory cell blocks and said memory cells within thereof; and
    a write/readout circuit, which is connected to a plurality of said memory cell blocks, configured to specify a y address relating to a plurality of memory cell blocks and said memory cells within thereof;
    wherein data is written in said memory cells by said write/readout circuit, in the case of being specified by said write address decoder and said write/readout circuit.

14. The semiconductor device according to claim 1, wherein in a case in which the truth table data stored in the memory cells of a part of said memory cell blocks is rewritten of a plurality of said memory cell blocks, operation is changed in accordance with the rewritten truth table data thereof.

15. A semiconductor device which is the semiconductor device according to claim 1 making up a system LSI, wherein a self-test, and a test for another logic circuit of said system LSI are performed.

16. The semiconductor device according to claim 1, wherein compiling is performed with a C program in which operation is described.

17. The semiconductor device according to claim 1, wherein said readout address decoders include a plurality of logic circuits;
    and wherein the transistors employed for the plurality of logic circuits thereof are N-MOS.

* * * * *

UNITED STATES PATENT AND TRADEMARK OFFICE
CERTIFICATE OF CORRECTION

PATENT NO. : 7,652,946 B2
APPLICATION NO. : 12/094770
DATED : January 26, 2010
INVENTOR(S) : Masayuki Satoh Page 1 of 1

It is certified that error appears in the above-identified patent and that said Letters Patent is hereby corrected as shown below:

Column 4, line 64, which reads, "SAND circuits", should read -- NAND circuits --

Signed and Sealed this

Seventh Day of September, 2010

David J. Kappos
*Director of the United States Patent and Trademark Office*